United States Patent
Choi et al.

(10) Patent No.: US 10,720,597 B2
(45) Date of Patent: Jul. 21, 2020

(54) ELECTROLUMINESCENT DISPLAY DEVICE

(71) Applicant: LG Display Co., Ltd., Seoul (KR)

(72) Inventors: Yong-Hoon Choi, Paju-si (KR);
Keum-Kyu Min, Paju-si (KR);
Won-Hoe Koo, Paju-si (KR)

(73) Assignee: LG Display Co., Ltd., Seoul (KR)

(*) Notice: Subject to any disclaimer, the term of this patent is extended or adjusted under 35 U.S.C. 154(b) by 223 days.

(21) Appl. No.: 16/109,691

(22) Filed: Aug. 22, 2018

(65) Prior Publication Data
US 2019/0067624 A1    Feb. 28, 2019

(30) Foreign Application Priority Data
Aug. 31, 2017 (KR) .................... 10-2017-0110950

(51) Int. Cl.
*H01L 27/32* (2006.01)
*H01L 51/52* (2006.01)

(52) U.S. Cl.
CPC ...... *H01L 51/5221* (2013.01); *H01L 27/3246* (2013.01); *H01L 27/3262* (2013.01); *H01L 51/5203* (2013.01); *H01L 51/5262* (2013.01); *H01L 51/5271* (2013.01); *H01L 51/5206* (2013.01)

(58) Field of Classification Search
CPC ............. H01L 51/5221; H01L 51/5262; H01L 27/3246; H01L 51/5206; H01L 51/5203; H01L 51/5209; H01L 51/5225
See application file for complete search history.

(56) References Cited

U.S. PATENT DOCUMENTS

| 2004/0113550 A1* | 6/2004 | Adachi ............... H05B 33/22 313/512 |
| 2017/0294493 A1* | 10/2017 | Yoo ...................... H01L 51/5253 |
| 2019/0074471 A1* | 3/2019 | Abe ..................... H01L 51/5209 |

FOREIGN PATENT DOCUMENTS

WO    WO-2017195560 A1 * 11/2017 ......... H01L 51/5253

* cited by examiner

*Primary Examiner* — Erik T. K. Peterson
*Assistant Examiner* — Pavel G Ivanov
(74) *Attorney, Agent, or Firm* — Fenwick & West LLP

(57) ABSTRACT

An electroluminescent display device includes: a substrate including a subpixel; a thin film transistor disposed at the subpixel; an overcoat layer disposed on the thin film transistor; a first electrode disposed on the overcoat layer and electrically connected to the thin film transistor; a bank layer disposed on the overcoat layer and the first electrode, the bank layer including a plurality of openings configured to expose the first electrode and a plurality of opening patterns formed in a bar shape to expose the first electrode and connect the plurality of openings; an emitting layer disposed on the first electrode and the bank layer; and a second electrode disposed on the emitting layer.

20 Claims, 18 Drawing Sheets

ELECTROLUMINESCENT DISPLAY DEVICE

CROSS-REFERENCE TO RELATED APPLICATION

The present application claims priority under 35 U.S.C. § 119(a) of Republic of Korea Patent Application No. 10-2017-0110950, filed on Aug. 31, 2017, which is hereby incorporated by reference in its entirety for all purposes as if fully set forth herein.

BACKGROUND

Technical Field

The present disclosure relates to an electroluminescent display device, and more particularly, to an electroluminescent display device capable of preventing degradation of image quality which is caused due to disconnection of an electrode while improving light extraction efficiency.

Discussion of the Related Art

In recent years, flat panel displays having characteristics such as being thin, lightweight, and having low power consumption have been widely developed and applied to various fields.

Among the flat panel displays, an electroluminescent display device is a device in which a charge is injected into an emitting layer formed between a cathode, which is an electron-injecting electrode, and an anode, which is a hole-injecting electrode, such that excitons are formed, and then radiative recombination of the excitons occurs such that light is emitted.

Such an electroluminescent display device may be formed even on a flexible substrate such as plastic, has a large contrast ratio due to being a self-emitting type, is able to realize a dynamic image due to having a response time of about several microseconds (μs), has no limit in terms of viewing angle, is stable even at a low temperature, and is able to be driven at a relatively low voltage of DC 5 V to 15 V. However, existing electroluminescent display devices may have reduced brightness or light extraction efficiency due to diffusion of light rays emitted from electrodes of light emitting diodes, or due to disconnection of part of an electrode of a light emitting diode.

SUMMARY

Accordingly, embodiments of the present invention are directed to electroluminescent display devices that substantially obviate one or more of the problems due to limitations and disadvantages of the related art.

An advantage of embodiments of the present invention is to provide an electroluminescent display device capable of improving light extraction efficiency through openings of a bank and preventing degradation of image quality due to disconnection of an electrode (e.g., cathode) by forming a connection pattern for connecting the openings.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of an embodiment of the present invention, as embodied and broadly described herein, an electroluminescent display device includes: a substrate including a subpixel; a thin film transistor disposed at the subpixel; an overcoat layer disposed on the thin film transistor; a first electrode disposed on the overcoat layer and electrically connected to the thin film transistor; a bank layer disposed on the overcoat layer and the first electrode, the bank including a plurality of openings configured to expose the first electrode, and a plurality of opening patterns formed in a bar shape to expose the first electrode and connect the plurality of openings; an emitting layer disposed on the first electrode and the bank layer; and a second electrode disposed on the emitting layer.

In an embodiment, an electroluminescent display device includes: a substrate including a subpixel; a thin film transistor disposed at the subpixel; an overcoat layer disposed on the thin film transistor; a first electrode disposed on the overcoat layer and electrically connected to the thin film transistor; a bank layer disposed on the overcoat layer and the first electrode, the bank layer exposing the first electrode at openings and opening patterns; an emitting layer disposed on the first electrode and the bank layer; and a second electrode disposed on the emitting layer, the second electrode including: a first plurality of portions in the openings and spaced apart from each other, and a second plurality of portions in the opening patterns, the second plurality of portions connecting the first plurality of portions.

In an embodiment, an electroluminescent display device includes: an anode electrode; a bank layer exposing the anode electrode at openings and opening patterns, the openings spaced apart from each other; a cathode electrode including a first plurality of portions in the openings and a second plurality of portions in the opening patterns, the second plurality of portions connecting the first plurality of portions; and an emissive layer coupled between the anode electrode and the cathode electrode for emitting light through the openings.

It is to be understood that both the foregoing general description and the following detailed description are exemplary and explanatory and are intended to provide further explanation of the embodiments of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
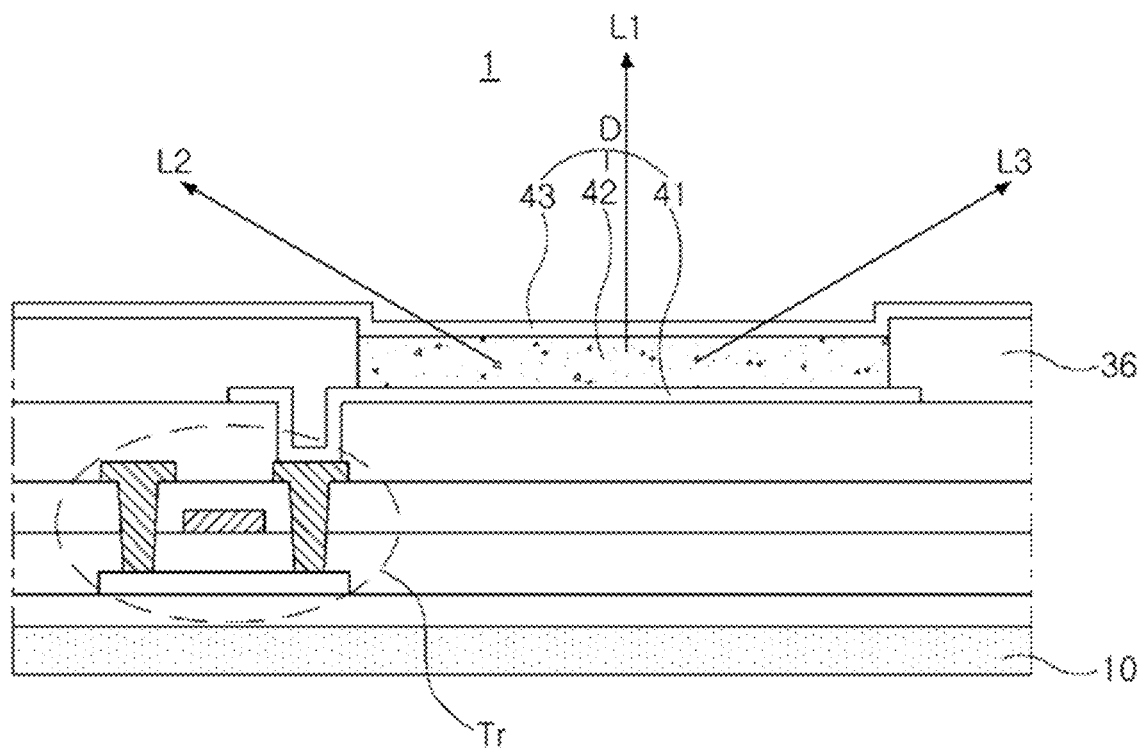
FIG. 1 is a cross-sectional view illustrating an electroluminescent display device according to the related art.

FIG. 1 is a cross-sectional view illustrating an electroluminescent display device according to the related art.

As illustrated in FIG. 1, an electroluminescent display device 1 includes a substrate 10, a thin film transistor Tr disposed on the substrate 10, and a light emitting diode D disposed on the substrate 10 and connected to the thin film transistor Tr, and an encapsulation layer (not shown in FIG. 1) may be disposed on the light emitting diode D.

The light emitting diode D includes a first electrode 41, an emitting layer 42, and a second electrode 43, and light from the emitting layer 42 is output to outside of the electroluminescent display device 1 through the second electrode 43.

The light emitted from the emitting layer 42 passes through various configurations of the electroluminescent display device 1 and exits the electroluminescent display device 1 in an upper direction thereof.

The electroluminescent display device 1 emits light ray L1 in a direction orthogonal to the substrate. In contrast, the light rays L2 and L3 are emitted at an angle relative to the orthogonal direction. Thus, there is a problem in that light extraction efficiency of the electroluminescent display device 1 is decreased.

Hereinafter, exemplary embodiments of the present invention will be described with reference to the accompanying drawings.

Figure 2:
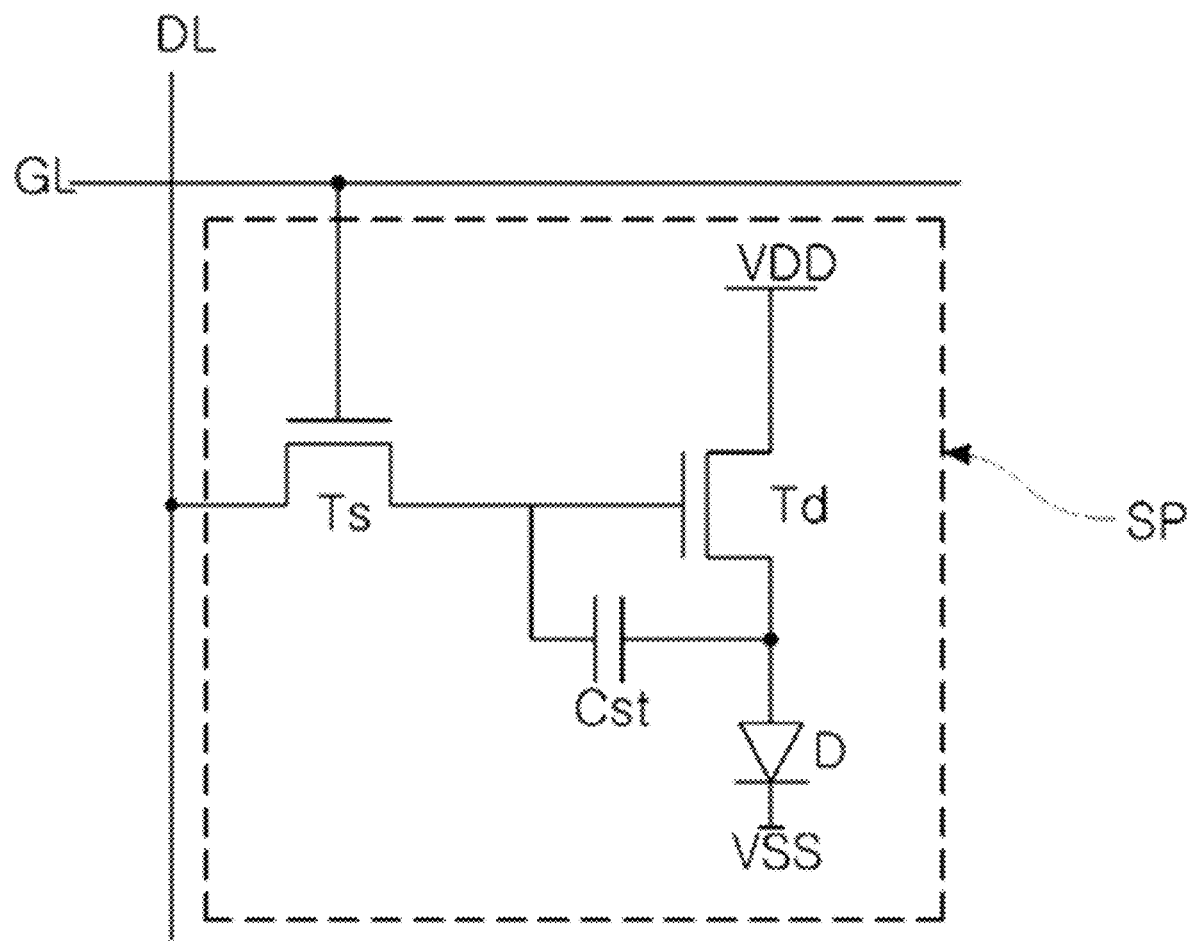
FIG. 2 is a circuit diagram illustrating a single subpixel area of an electroluminescent display device according to an embodiment of the present invention.

FIG. 2 is a circuit diagram illustrating a single subpixel area of an electroluminescent display device according to an embodiment of the present invention.

As illustrated in FIG. 2, the electroluminescent display device according to an embodiment of the present invention includes a gate line GL and a data line DL which intersect with each other and define a subpixel area SP. A switching thin film transistor Ts, a driving thin film transistor Td, a storage capacitor Cst, and a light emitting diode D are formed in each subpixel SP.

More specifically, a gate electrode of the switching thin film transistor Ts is connected to the gate line GL, and a source electrode is connected to the data line DL. A gate electrode of the driving thin film transistor Td is connected to a drain electrode of the switching thin film transistor Ts, and a drain electrode is connected to a high-potential voltage VDD. An anode of the light emitting diode D is connected to the source electrode of the driving thin film transistor Td, and a cathode is connected to a low-potential voltage VSS. The storage capacitor Cst is connected to the gate electrode and the source electrode of the driving thin film transistor Td.

In an image display operation of such an electroluminescent display device, the switching thin film transistor Ts is turned on in accordance with a gate signal applied through the gate line GL, and in this case, a data signal applied to the data line DL is applied to the gate electrode of the driving thin film transistor Td and one electrode of the storage capacitor Cst through the switching thin film transistor Ts.

The driving thin film transistor Td is turned on in accordance with the data signal and controls a current, which flows in the light emitting diode D so as to display an image. The light emitting diode D emits light due to a current of the high-potential voltage VDD transmitted through the driving thin film transistor Td.

That is, since an amount of current which flows in the light emitting diode D is proportional to an amplitude of the data signal, and an intensity of light emitted by the light emitting diode D is proportional to the amount of current flowing in the light emitting diode D, the pixel area P may display light corresponding to values of a grayscale. The intensity of displayed light differs in accordance with the amplitude of the data signal, and as a result, the electroluminescent display device displays an image.

The storage capacitor Cst serves to maintain a charge, which corresponds to the data signal during one frame in order to make an amount of current flowing in the light emitting diode D constant and maintain a grayscale, for example, the light emitting diode D displays light having a constant intensity.

A transistor and/or a capacitor other than the switching and driving thin film transistors Ts and Td and the storage capacitor Cst may be further added in the subpixel area SP.

Figure 3:
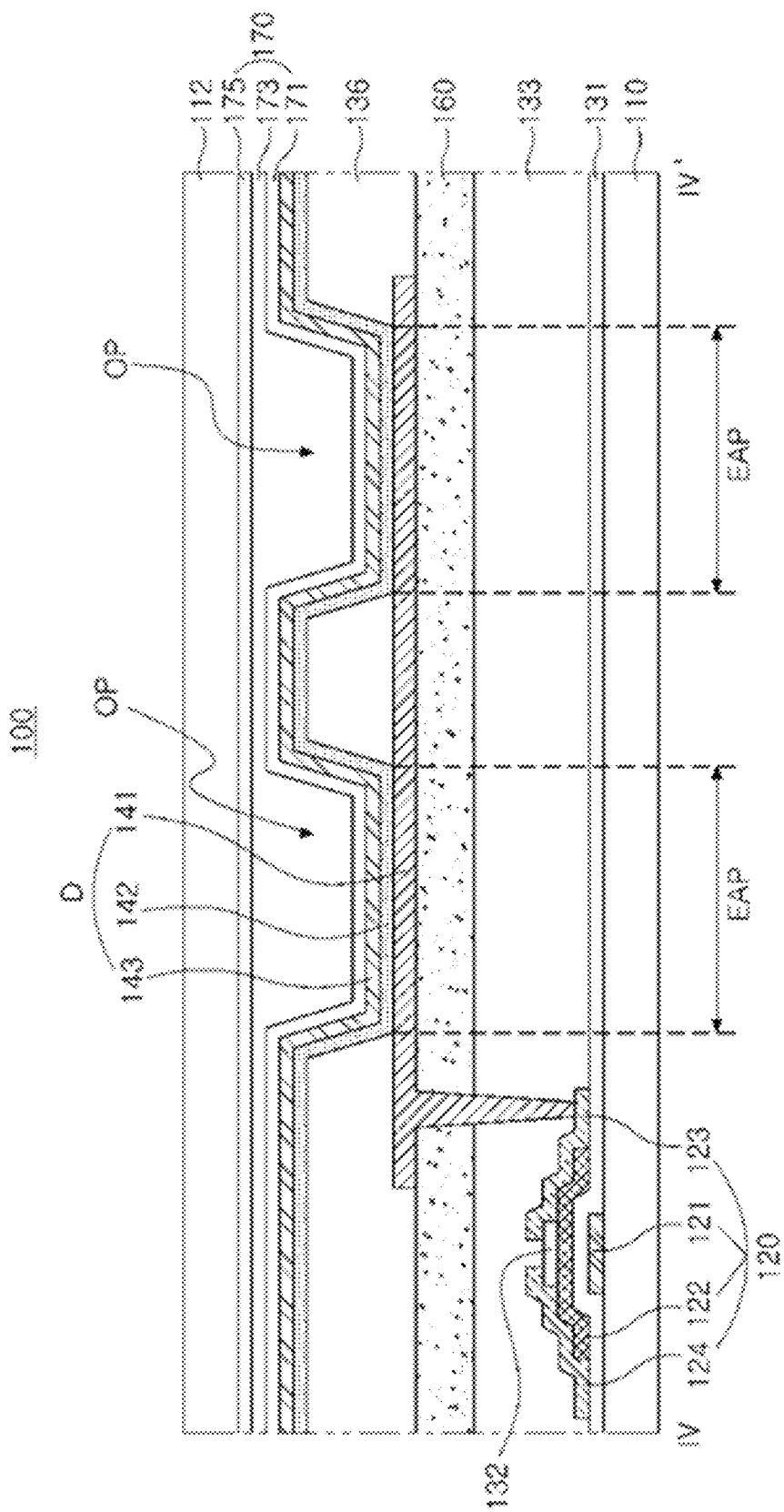
FIG. 3 is a cross-sectional view illustrating an electroluminescent display device according to an embodiment of the present invention.

FIG. 3 is a cross-sectional view illustrating an electroluminescent display device according to an embodiment of the present invention.

As illustrated in FIG. 3, an electroluminescent display device 100 according to an embodiment of the present invention may include a first substrate 110, a thin film transistor 120, an overcoat layer 160, a light emitting diode D electrically connected to the thin film transistor 120, a sealing film (or sealing layer) 170, and a second substrate 112.

The electroluminescent display device 100 according to the embodiment of FIG. 3 is illustrated as being a top emission type in which light from the emitting layer 142 is output to outside of the electroluminescent display device 100 through a second electrode 143, but embodiments are not limited thereto.

For example, the electroluminescent display device 100 according to an embodiment of the present invention may also be a bottom emission type in which light from the emitting layer 142 is output to outside of the electroluminescent display device 100 through a first electrode 141.

The electroluminescent display device 100 according to an embodiment of the present invention may include, on the first substrate 110, a thin film transistor 120, which includes a gate electrode 121, an active layer 122, a source electrode 123, and a drain electrode 124.

Specifically, the gate electrode 121 of the thin film transistor 120 and a gate insulating film 131 may be disposed on the first substrate 110.

The active layer 122, which overlaps the gate electrode 121, may be disposed on the gate insulating film 131.

An etch stopper 132 for protecting a channel area of the active layer 122 may be disposed on the active layer 122.

The source electrode 123 and the drain electrode 124, which come into contact with the active layer 122, may be disposed on the active layer 122.

The electroluminescent display device to which embodiments of the present invention are applicable is not limited to that illustrated in FIG. 3. The electroluminescent display device may further include a buffer layer disposed between the first substrate 110 and the active layer 122, and the etch stopper 132 may not be disposed thereon.

For convenience of description, only the driving thin film transistor has been illustrated in FIG. 3 from among various thin film transistors that may be included in the electroluminescent display device 100. Although the thin film transistors 120 will be described herein as having an inverted staggered structure or bottom gate structure in which, with respect to the active layer 122, the gate electrode 121 is disposed opposite the source electrode 123 and the drain electrode 124, this is one example. In other embodiments, the electroluminescent display device 100 may include a thin film transistor, which has a coplanar structure or top gate structure in which, with respect to the active layer 122, the gate electrode 121 is disposed to be collinear with the source electrode 123 and the drain electrode 124.

A protective layer 133 may be disposed on the drain electrodes 124 and the source electrodes 123.

In the example shown in FIG. 3, although the protective layer 133 is illustrated as smoothing an upper portion of the thin film transistor 120, in other embodiments, the protective layer 133 may also be disposed along the shapes of surfaces of configurations located below the protective layer 133 instead of smoothing the upper portion of the thin film transistor 120.

The overcoat layer 160 may be disposed on the protective layer 133.

In some embodiments, the protective layer 133 may be omitted. That is, the overcoat layer 160 may also be disposed on the thin film transistor 120.

The first electrode 141 may be disposed on the overcoat layer 160.

The first electrode 141 may be an anode or cathode for supplying one of electrons or holes to the emitting layer 142.

A case in which the first electrode 141 of the electroluminescent display device according to an embodiment of the present invention is an anode will be described as an example.

To obtain a micro-cavity effect, the first electrode 141 may be formed of a conductive material with a high reflectance such as a stacked structure of aluminum (Al) and titanium (Ti) (Ti/Al/Ti), a stacked structure of Al and indium tin oxide (ITO), an APC alloy, or a stacked structure of an APC alloy and ITO (e.g., ITO/APC/ITO). The APC alloy refers to an alloy of silver (Ag), palladium (Pd), and copper (Cu).

The first electrode 141 may be connected to the source electrode 123 of the thin film transistor 120 through a contact hole formed in the overcoat layer 160 and may be separately formed in each subpixel area.

Although the electroluminescent display device 100 according to an embodiment of the present invention has been described using an example where the thin film transistor 120 is an N-type thin film transistor in which the first electrode 141 is connected to the source electrode 123, embodiments are not limited thereto. In other embodiments, the thin film transistor 120 is a P-type thin film transistor, and the first electrode 141 may also be connected to the drain electrode 124.

A bank layer 136 may be disposed on the first electrode 141 and the overcoat layer 160.

The bank layer 136 may partition each subpixel.

The bank layer 136 of the electroluminescent display device 100 according to an embodiment of the present invention may include a plurality of openings OP configured to expose the first electrode 141 at subpixel areas.

Accordingly, a plurality of emissive area parts EAP may be formed at the subpixel areas due to the plurality of openings OP of the bank layer 136.

In order to increase an amount of reflected light emitted outward from the emitting layer 142, an area of the top (or top surface, for instance, toward the second substrate 112) of the plurality of openings OP may be greater than or equal to an area of the bottom (or bottom surface, for instance, toward the first substrate 110) thereof, as shown in FIG. 3.

Further, in order to effectively reflect light emitted outward from the emitting layer 142 upward, the bank layer 136 may be formed of an organic material having a refractive index lower than the refractive index of the emitting layer 142.

For example, the bank layer 136 may be formed of a photo acrylic organic material having a refractive index of 1.6 or lower, but embodiments are not limited thereto.

The bank layer 136 may be formed with a height of 3 μm or greater in order to increase the amount of light emitted from the emitting layer 142 that will be reflected by the bank layer 136, but embodiments are not limited thereto.

The emitting layer 142 may be disposed on the first electrode 141 and the bank layer 136.

In some embodiments, the emitting layer 142 may include an emitting layer that emits only one of blue light, red light, or green light. The emitting layers 142 of different subpixel areas may emit light having a different colors from each other.

In some embodiments, the emitting layer 142 may include multiple emitting layers, which may each emit different colors of light. The emitting layer 142 may have a tandem white structure in which a plurality of emitting layers are stacked to emit white light.

For example, the emitting layer 142 may include a first emitting layer configured to emit blue light and a second emitting layer disposed on the first emitting layer and configured to emit light having color which turns white when mixed with blue.

The second emitting layer may be an emitting layer configured to emit yellow-green light.

In this case, a color filter may be disposed at the second substrate 112.

A luminescent material of the emitting layer 142 may be an organic luminescent material or an inorganic luminescent material such as a quantum dot.

Also, the emitting layer 142 may be formed to cover the first electrode 141 and the bank layer 136, e.g., along a shape or contour of the first electrode 141 and the bank layer 136. The emitting layer 142 may be disposed in the plurality of emissive area parts EAP.

The emitting layer 142 may be formed of an organic material having a refractive index of about 1.8 or higher, but embodiments are not limited thereto.

The second electrode 143 for supplying one of electrons or holes to the emitting layer 142 may be disposed on the emitting layer 142.

The second electrode 143 may be an anode or a cathode.

A case in which the second electrode 143 of the electroluminescent display device 100 according to an embodiment of the present invention is a cathode will be described as an example.

The second electrode 143 is formed on the emitting layer 142. That is, the second electrode 143 may be formed to cover the emitting layer 142 along the shape or contour of the emitting layer 142.

The second electrode 143 may be formed of a transparent conductive material (TCO) such as ITO and indium zinc oxide (IZO) capable of transmitting light, or may be formed of a semi-transmissive conductive material such as magnesium (Mg), Ag, or an alloy of Mg and Ag.

A capping layer (not shown in FIG. 3) may be formed on the second electrode 143.

The capping layer may be formed of an organic material having a refractive index of about 1.8 or higher or an organic material whose refractive index matches that of the emitting layer 142, but embodiments are not limited thereto. The capping layer may also be omitted.

A sealing film 170 may be formed on the second electrode 143. In an embodiment, the sealing film 170 may include at least one inorganic film and at least one organic film to prevent permeation of oxygen or moisture into the emission layer 142 and the second electrode 143.

The sealing film 170 may include a first inorganic film 171, an organic film 173, and a second inorganic film 175.

For example, the first inorganic film 171 may be formed on the second electrode 143 so as to cover the second electrode 143.

The organic film 173 may be formed on the first inorganic film 171 to prevent injection of particles into the emitting layer 142 and the second electrode 143 through the first inorganic film 171.

The second inorganic film 175 may be formed on the organic film 173 so as to cover at least a portion or all of the organic film 173.

The above-described structure of the sealing film 170 is one example, and embodiments are not limited thereto.

Each of the first and second inorganic films 171 and 175 may be formed of silicone nitride, aluminum nitride, zirconium nitride, titanium nitride, hafnium nitride, tantalum nitride, silicone oxide, aluminum oxide, or titanium oxide.

The organic film 173 may be formed to be transparent so that light emitted from the emitting layer 142 passes therethrough. In an embodiment, the organic film 173 may be formed of an organic material through which 99% or more of the light emitted from the emitting layer 142 may pass, but embodiments are not limited thereto.

The organic film 173 may be disposed to have a smooth top surface and fill the openings of the bank layer 136 so as to smooth a stepped part due to the openings.

The organic film 173 may be formed of an organic material having a refractive index of about 1.8 or higher. For example, the organic film 173 may include a vinyl compound, a photopolymerization initiator, toluene, or 2,6-di-tert-butyl-4-methylphenol, but embodiments are not limited thereto.

In some embodiments, the sealing film 170 of the first substrate 110 and the second substrate 112 may be adhered through an adhesive layer (not shown in FIG. 3).

In some embodiments, a color filter (not shown in FIG. 3) and a black matrix (not shown in FIG. 3) may also be formed on the second substrate 112.

Figure 4:
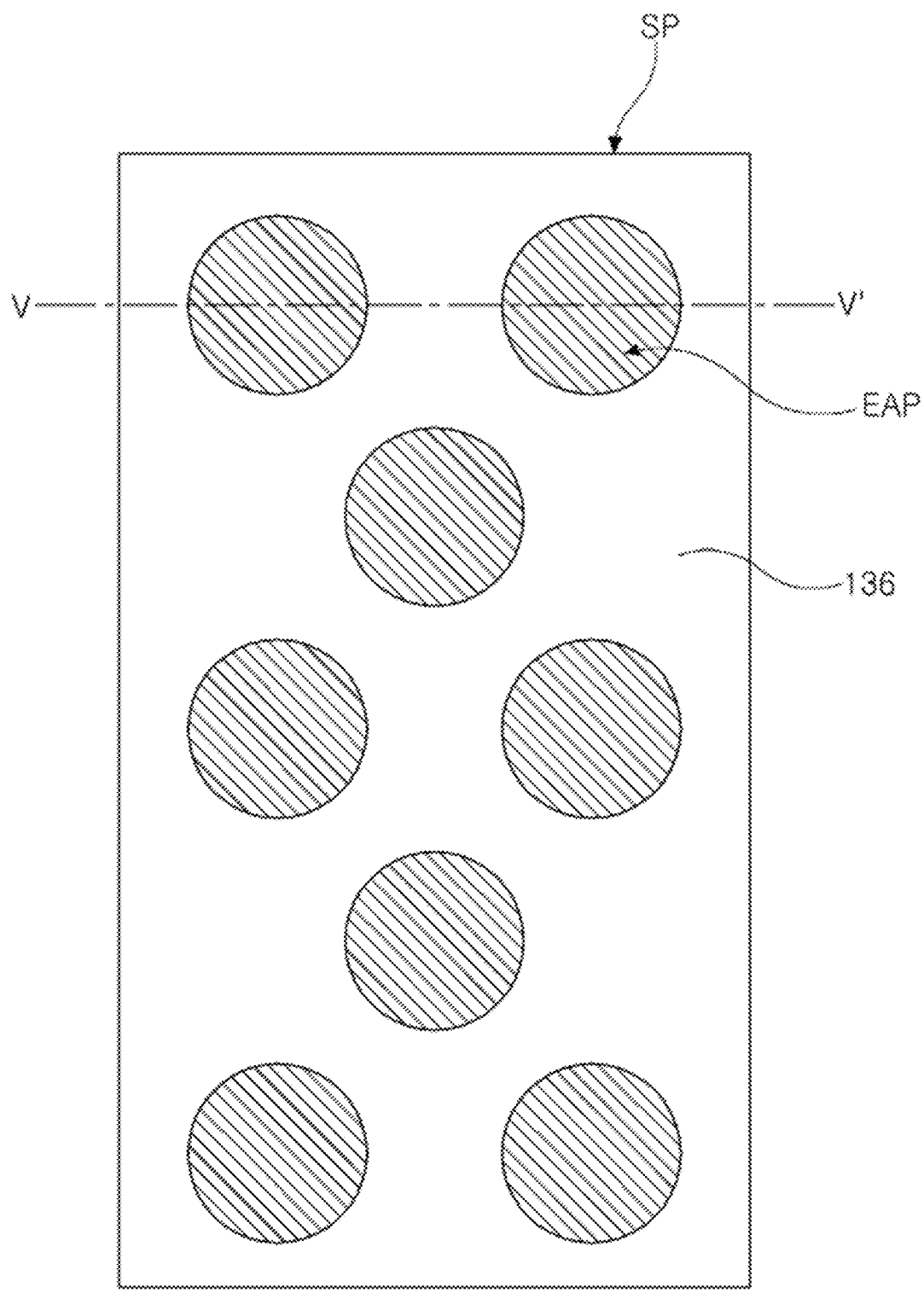
FIG. 4 is a plan view illustrating a single subpixel of the electroluminescent display device shown in FIG. 3 according to an embodiment of the present invention.

FIG. 4 is a plan view illustrating a single subpixel of the electroluminescent display device shown in FIG. 3 according to an embodiment of the present invention.

As illustrated in FIG. 4, a single subpixel SP may include a plurality of emissive area parts EAP.

For example, when the subpixel SP is a red subpixel SP, the subpixel SP may include a plurality of red-emissive area parts EAP configured to emit red light.

When the subpixel SP is a green subpixel SP, the subpixel SP may include a plurality of green-emissive area parts EAP configured to emit green light.

When the subpixel SP is a blue subpixel SP, the subpixel SP may include a plurality of blue-emissive area parts EAP configured to emit blue light.

When the subpixel SP is a white subpixel SP, the subpixel SP may include a plurality of white-emissive area parts EAP configured to emit white light.

The plurality of emissive area parts EAP are partitioned by the bank layer 136.

That is, the bank layer 136 includes the plurality of openings OP (as shown in FIG. 3) configured to expose the first electrode 141 (as shown in FIG. 3) at a single subpixel SP, and the plurality of openings OP correspond to the emissive area parts EAP of the emitting layer 142.

The plurality of emissive area parts EAP are illustrated as having a circular shape in the plan view in FIG. 4, but embodiments are not limited thereto. For example, the plurality of emissive area parts EAP may also have a polygonal shape, such as a triangular shape, a quadrangular shape, or a pentagonal shape, in the plan view.

Figure 5:
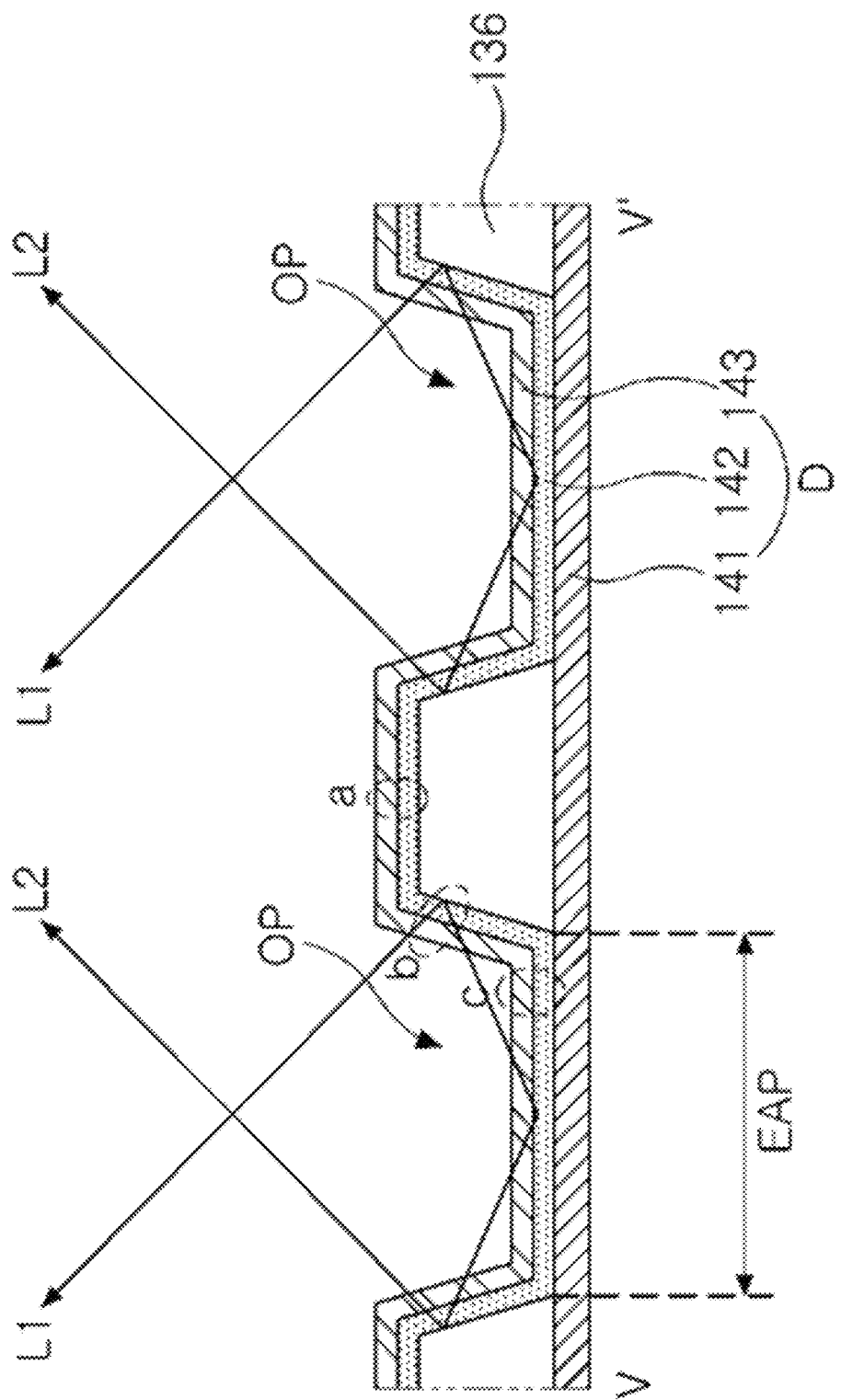
FIG. 5 is a cross-sectional view of an electroluminescent display device taken along line V-V' of FIG. 4 according to an embodiment.

FIG. 5 is a cross-sectional view of an electroluminescent display device taken along line V-V' of FIG. 4 according to an embodiment.

As illustrated in FIG. 5, rays of light L1 and L2 that travel laterally from the emitting layer 142 may travel after being reflected in a direction vertical to the second substrate due to the bank layer 136. For example, the rays of light L1 and L2 emitted from the emitting layer 142 initially have greater lateral components (e.g., in a direction parallel to the first substrate 110 or second substrate 112 as shown in FIG. 3) than vertical components (e.g., in a direction orthogonal to one of the substrates). After being reflected by the bank layer 136, the vertical components of the rays of light L1 and L2 increase and the lateral components decrease.

That is, by disposing the bank layer 136 having the plurality of openings OP at the subpixel SP so that the bank layer 136 surrounds the plurality of emissive area parts EAP, an optical path of the rays of light L1 and L2 output outward from the plurality of emissive area parts EAP is changed to a direction that is more vertical (e.g., orthogonal) relative to the second substrate 112 (shown in FIG. 3) due to the bank layer 136 surrounding the emissive area parts EAP. Therefore, light extraction efficiency of the electroluminescent display device 100 may be improved.

Figure 6A:
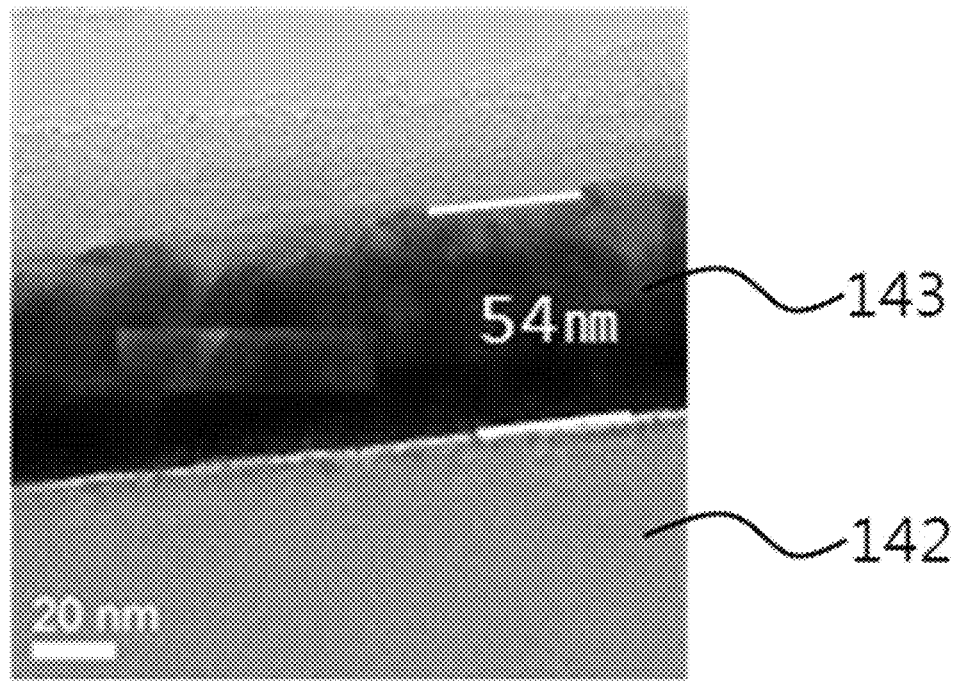
FIG. 6A is an enlarged picture of an area "a" of the electroluminescent display device shown in FIG. 5 according to an embodiment.

FIG. 6A is an enlarged picture of an area "a" of the electroluminescent display device shown in FIG. 5 according to an embodiment.

Figure 6B:
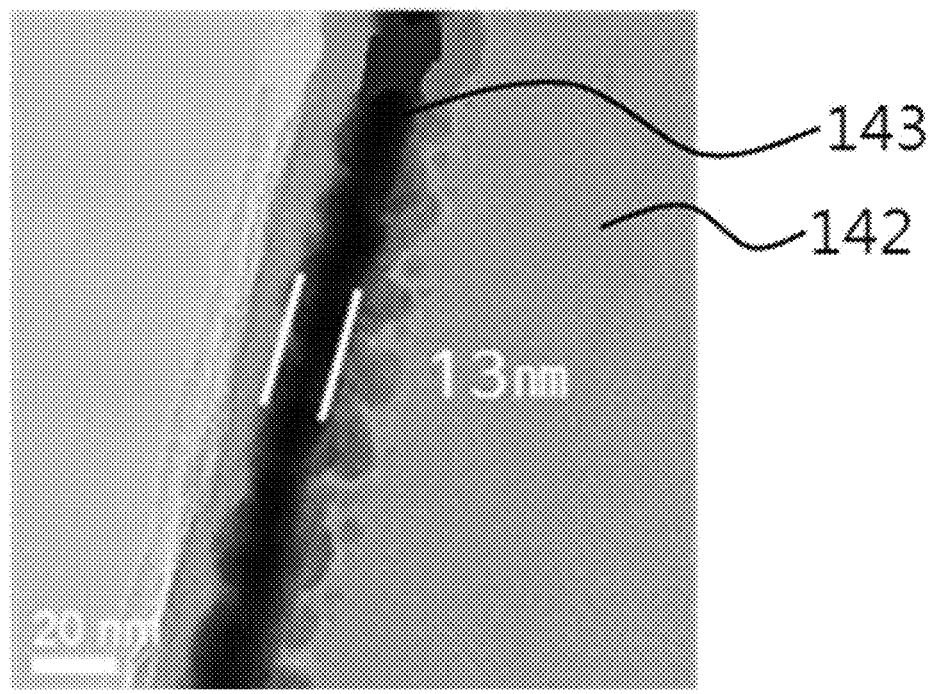
FIG. 6B is an enlarged picture of an area "b" of the electroluminescent display device shown in FIG. 5 according to an embodiment.

FIG. 6B is an enlarged picture of an area "b" of the electroluminescent display device shown in FIG. 5 according to an embodiment.

Figure 6C:
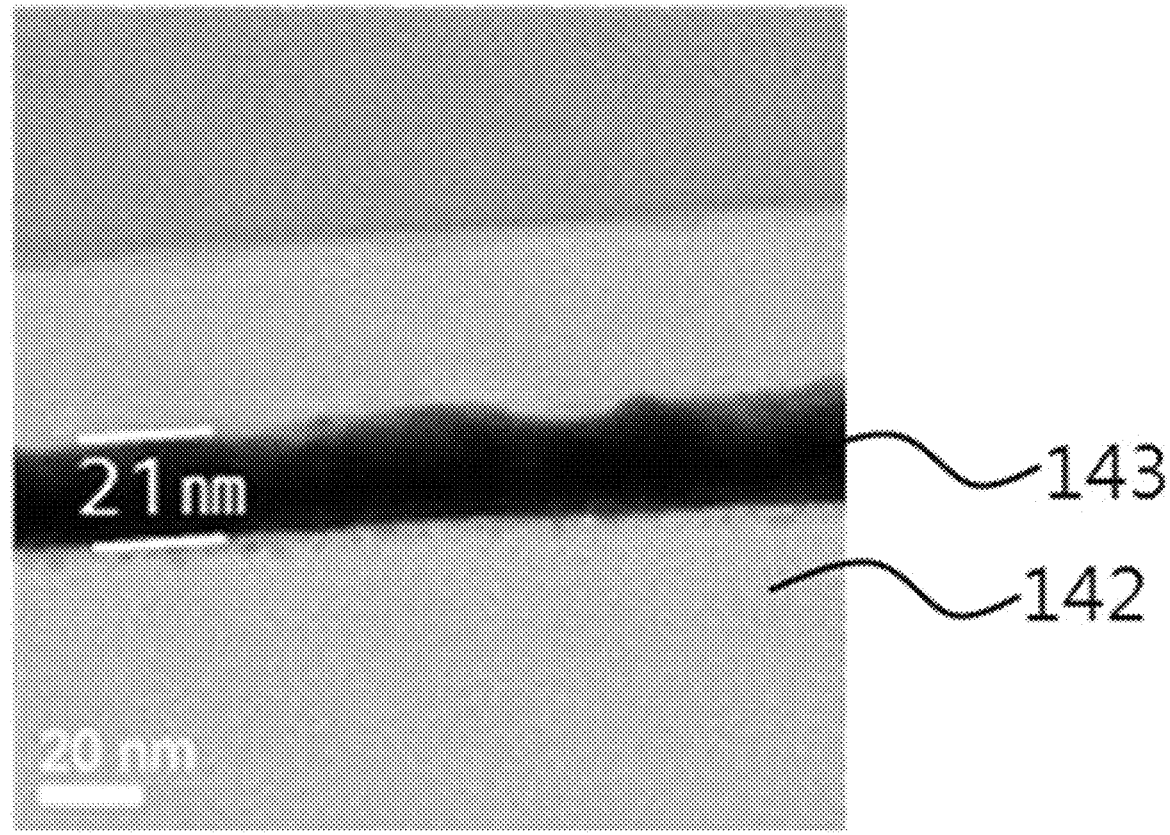
FIG. 6C is an enlarged picture of an area "c" of the electroluminescent display device shown in FIG. 5 according to an embodiment.

FIG. 6C is an enlarged picture of an area "c" of the electroluminescent display device shown in FIG. 5 according to an embodiment.

As illustrated in FIGS. 6A to 6C, since the emitting layer and the second electrode are disposed along the shape of the bank layer having the plurality of openings, the second electrode may be formed with different thicknesses at the area "a," the area "b," and the area "c" due to the process.

In the illustrated embodiments, a portion of the second electrode formed in the area "a," which is a top surface of the bank layer, has a thickness of 54 µm, a portion of the second electrode formed in the area "c," in which the openings of the bank layer are formed, has a thickness of 21 µm, and a portion of the second electrode formed in the area "b," which is a side surface connecting the top surface and the openings of the bank layer, has a thickness of 13 µm. During a process of manufacturing the second electrode 143, the thickness of the second electrode 143 formed in the area "b" may become smaller than a design value.

In addition, due to a decrease in width of the second electrode 143 formed in the area "b," a disconnection may occur in the second electrode formed in the area "b," which is the side surface at an angle of inclination relative to the areas "a" or "c." In particular, a portion of the second electrode 143 formed in the area "a" may become disconnected from another portion of the second electrode 143 formed in the area "c." When a portion of the second electrode 143 in an emissive area part EAP is disconnected from another portion of the second electrode 143, a corresponding light emitting diode D is not able to emit light (or may emit a reduced amount of light) due to the disconnection.

Figure 7:
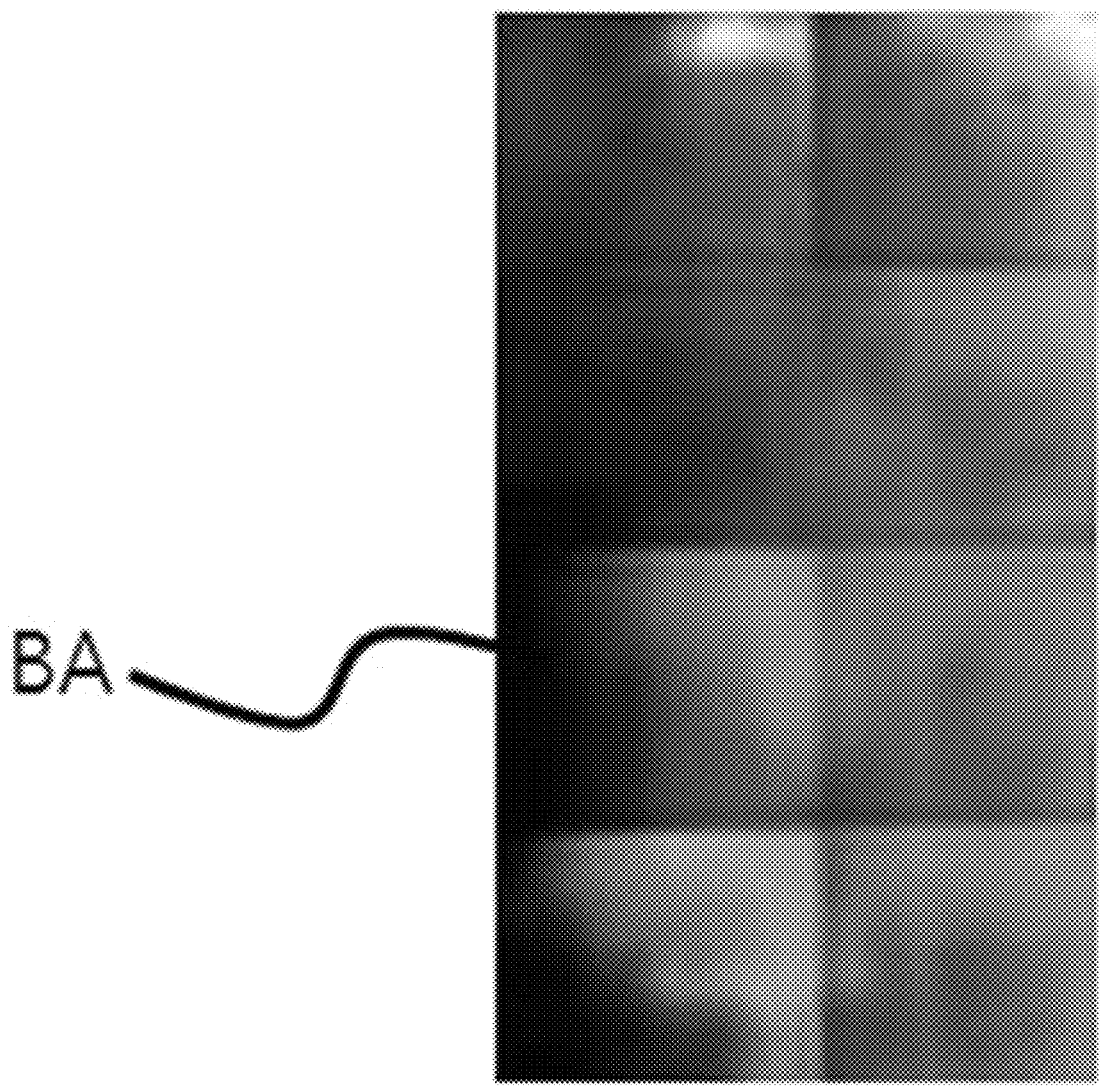
FIG. 7 is a picture illustrating generation of a black area due in a display device to disconnection of an electrode.

FIG. 7 is a picture illustrating generation of a black area in a display device due to disconnection of an electrode.

As illustrated in FIG. 7, when disconnection of an electrode (e.g., the second electrode 143 as shown in FIG. 6B) has occurred at a side surface of the bank layer 136, a black area BA partially occurs in a electroluminescent display device, and accordingly, image quality of the electroluminescent display device may be degraded.

As described above, in an embodiment of the present invention, by disposing the bank layer 136 having the plurality of openings OP at the subpixel SP so that the bank layer 136 surrounds the plurality of emissive area parts EAP, the optical path of the rays of light L1 and L2 output outward from the plurality of emissive area parts EAP is changed to a direction that is more vertical (e.g., orthogonal) relative to the second substrate 112 (e.g., as shown in FIG. 5) due to the bank layer 136 surrounding the emissive area parts EAP. Therefore, light extraction efficiency may be improved. However, the image quality may be degraded due to potential disconnection of the second electrode 143 at the side surface of the bank layer 136.

Hereinafter, an electroluminescent display device capable of further improving light extraction efficiency and simultaneously preventing degradation of image quality due to electrode disconnection will be described according other embodiments.

Hereinafter, detailed description of configurations identical or similar to those of the embodiment as shown in FIGS. 1-5 may be omitted.

Figure 8:
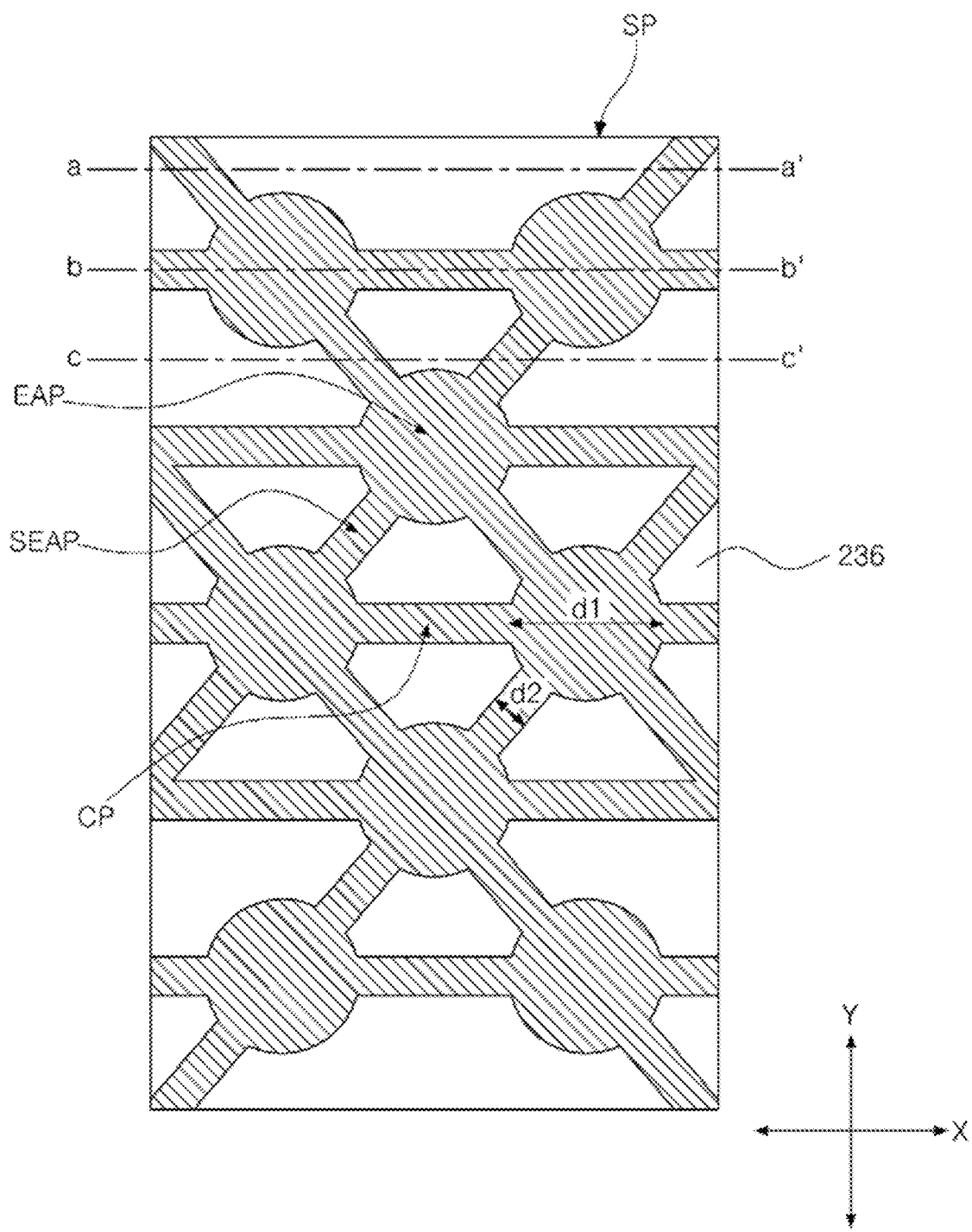
FIG. 8 is a plan view illustrating a single subpixel of an electroluminescent display device according to an embodiment of the present invention.

FIG. 8 is a plan view illustrating a single subpixel of an electroluminescent display device 100 according to an embodiment of the present invention.

As illustrated in FIG. 8, a single subpixel SP may include a plurality of main emissive area parts EAP that are spaced apart from each other.

For example, when the subpixel SP is a red subpixel SP, the single subpixel SP may include a plurality of red main emissive area parts EAP configured to emit red light.

When the subpixel SP is a green subpixel SP, the single subpixel SP may include a plurality of green main emissive area parts EAP configured to emit green light.

When the subpixel SP is a blue subpixel SP, the single subpixel SP may include a plurality of blue main emissive area parts EAP configured to emit blue light.

When the subpixel SP is a white subpixel SP, the single subpixel SP may include a plurality of white main emissive area parts EAP configured to emit white light.

As shown in the embodiment of FIG. 8, the electroluminescent display device 100 may include sub-emissive area parts SEAP configured to connect the main emissive area parts EAP.

That is, the sub-emissive area parts SEAP configured to connect the main emissive area parts EAP disposed to be spaced apart from each other may be disposed therebetween.

The sub-emissive area parts SEAP may be formed of a bar shape, but embodiments are not limited thereto.

For light to be uniformly emitted from the subpixel SP, the main emissive area parts EAP may be horizontally and/or vertically symmetrical with respect to a central point CP of the subpixel SP, but embodiments are not limited thereto.

The main emissive area parts EAP may be disposed at equal intervals, but embodiments are not limited thereto. In other embodiments, the main emissive area parts EAP may be disposed at unequal intervals or at two or more different predetermined intervals.

A single sub-emissive area part SEAP may be disposed to connect the main emissive area parts EAP spaced apart from each other, or a plurality of sub-emissive area parts SEAP may be connected to a single main emissive area part EAP.

In the embodiment shown in FIG. 8, the sub-emissive area parts SEAP may connect the spaced-apart main emissive area parts EAP in an X-axis direction and a diagonal direction between the X-axis and the Y-axis, but embodiments are not limited thereto. For instance, the sub-emissive area parts SEAP may connect the main emissive area parts EAP in one or more various other directions such as vertical or at different angles of diagonal direction. In some embodiments, the sub-emissive area parts SEAP may connect the main emissive area parts EAP in at least two different directions on a plane of the second electrode 143, e.g., a cathode electrode for a light emitting diode D.

Since the sub-emissive area parts SEAP may be disposed in the form of connecting the main emissive area parts EAP, a width d2 of the sub-emissive area parts SEAP may be formed to be narrower than a width d1 of the main emissive area parts EAP.

The size, number, width, and connection relationship of the main emissive area parts EAP and the sub-emissive area parts SEAP may vary in accordance with a type, size, or other attributes of an electronic product, e.g., including the electroluminescent display device 100.

The plurality of main emissive area parts EAP and the sub-emissive area parts SEAP may be partitioned from each other by a bank layer 236.

That is, the bank layer 236 includes a plurality of openings configured to expose a first electrode 141 (shown in FIG. 3) in the single subpixel SP, and the openings correspond to the main emissive area parts EAP.

The bank layer 236 may include opening patterns which connect the plurality of openings disposed at the single subpixel SP and expose the first electrode 141 (shown in FIG. 3), and the opening patterns may correspond to the sub-emissive area parts SEAP.

Although not illustrated in FIG. 8, the opening patterns may also be disposed to connect main emissive area parts EAP of adjacent subpixels SP.

That is, opening patterns of adjacent subpixels SP may be connected to each other at one or more sections.

The openings and the opening patterns will be described in more detail below.

The plurality of main emissive area parts EAP are illustrated as having a circular shape in the plan view in FIG. 8, but embodiments are not limited thereto. For example, the plurality of main emissive area parts EAP may also have a polygonal shape, such as a triangular shape, a quadrangular shape, or a pentagonal shape, in the plan view.

Figure 9A:
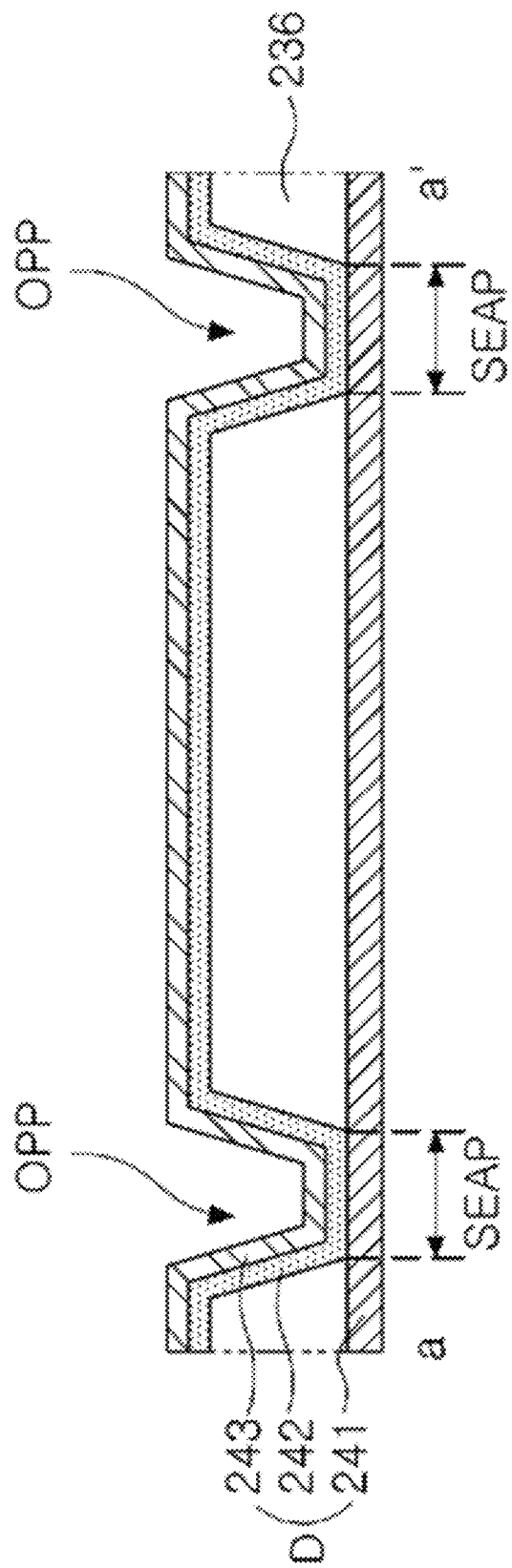
FIG. 9A is a cross-sectional view of an electroluminescent display device taken along line a-a' of FIG. 8 according to an embodiment.

FIG. 9A is a cross-sectional view of an electroluminescent display device taken along line a-a' of FIG. 8 according to an embodiment.

Figure 9B:
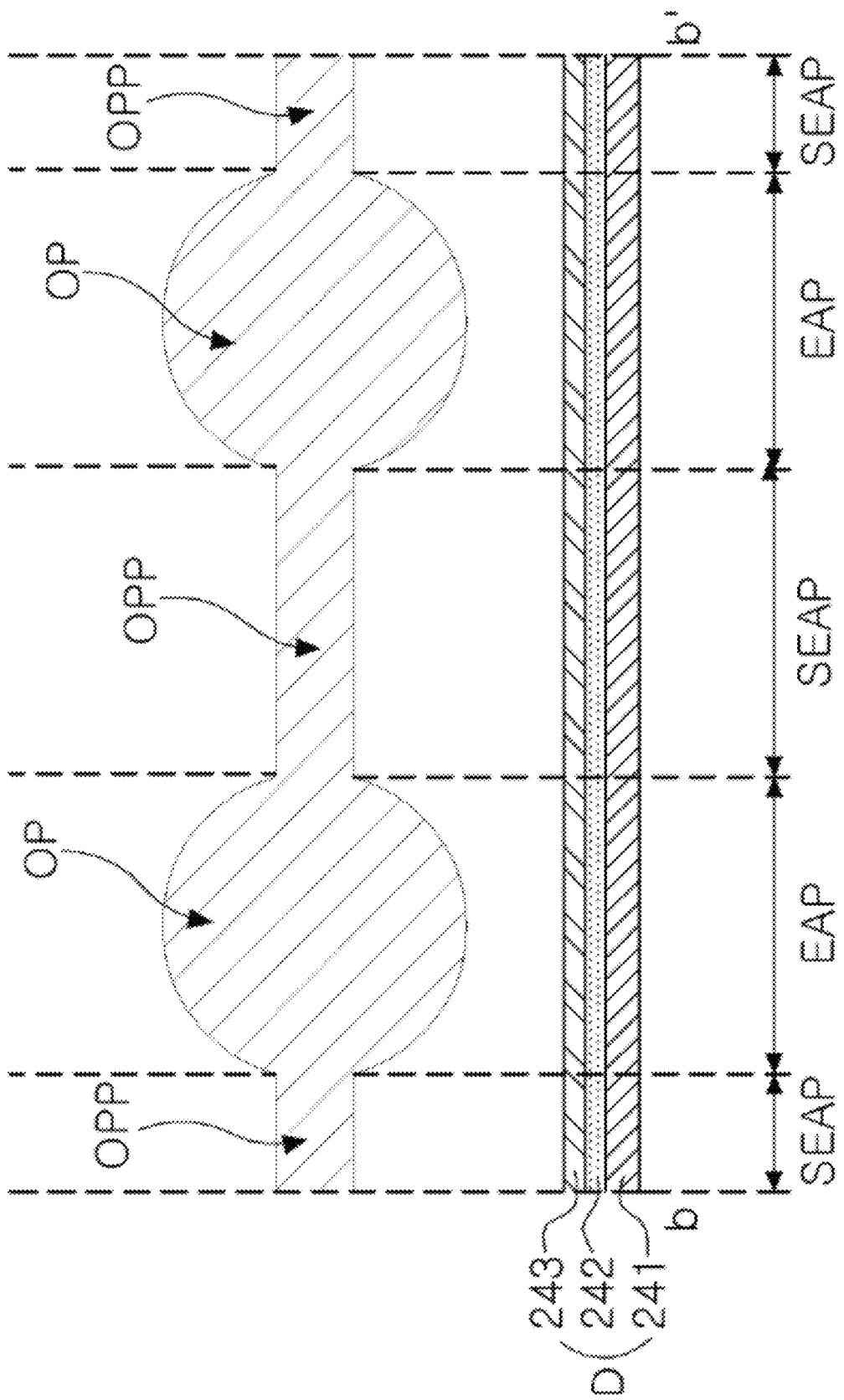
FIG. 9B is a cross-sectional view of an electroluminescent display device taken along line b-b' of FIG. 8 according to an embodiment.

FIG. 9B is a cross-sectional view of an electroluminescent display device taken along line b-b' of FIG. 8 according to an embodiment.

Figure 9C:
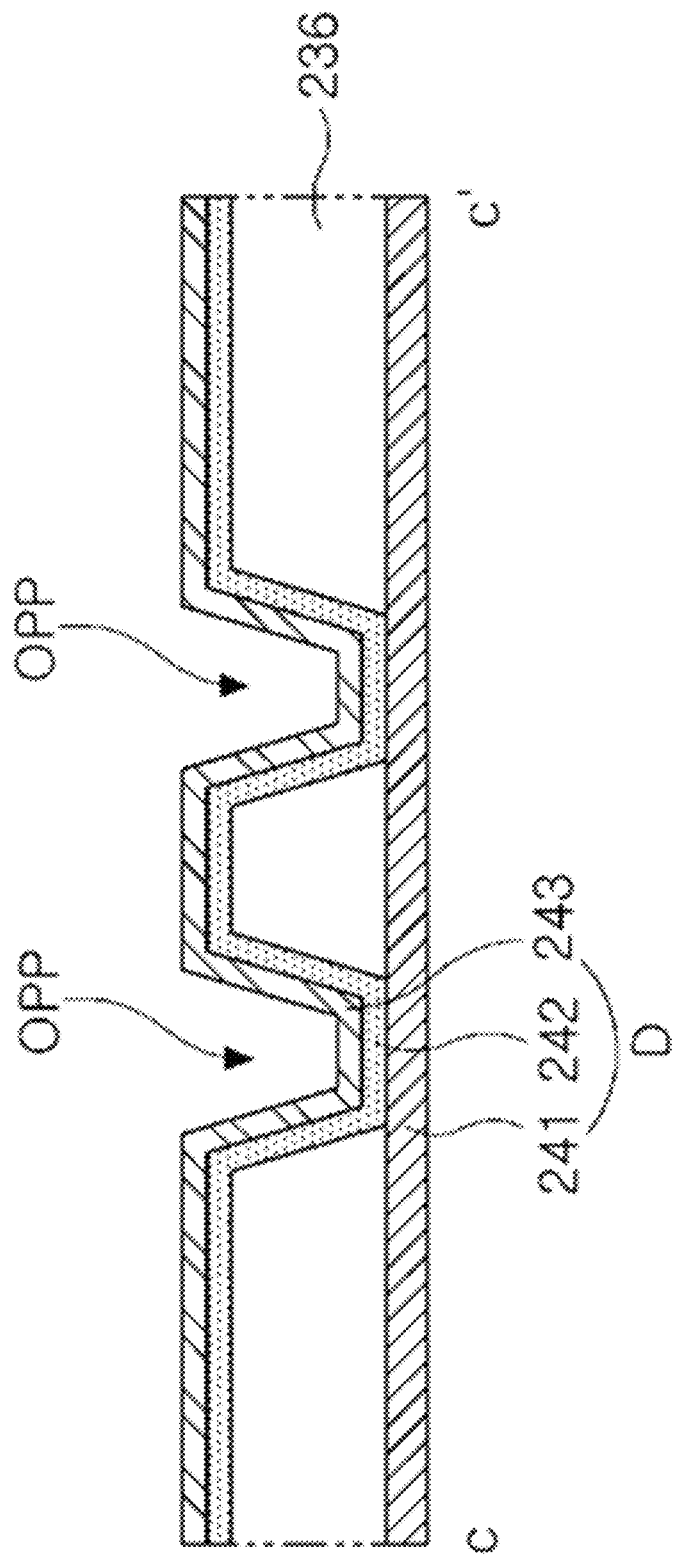
FIG. 9C is a cross-sectional view of an electroluminescent display device taken along line c-c' of FIG. 8 according to an embodiment

FIG. 9C is a cross-sectional view of an electroluminescent display device taken along line c-c' of FIG. 8 according to an embodiment.

As illustrated in the embodiment of FIG. 9A, the electroluminescent display device 100 may include a first electrode 241, the bank layer 236 disposed on the first electrode 241 and having opening patterns OPP that expose the first electrode 241, an emitting layer 242 disposed on the first electrode 241 and the bank layer 236, and a second electrode 243 disposed on the emitting layer 242.

That is, the bank layer 236 of the electroluminescent display device 100 may include the opening patterns OPP that connect the openings OP spaced apart from each other at each subpixel SP (shown in FIG. 8) and expose the first electrode 241.

The plurality of sub-emissive area parts SEAP may be formed by a plurality of opening patterns OPP of the bank layer 236.

Areas of the top of the openings OP and the opening patterns OPP may be greater than or equal to areas of the bottom thereof, e.g., as shown in FIG. 8.

The emitting layer 242 may be formed to cover the first electrode 241 and the bank layer 236, and the second electrode 243 may be formed to cover the emitting layer 242 along the shape or contour of the emitting layer 242.

As described above, as the first electrode 241 is exposed due to the opening patterns OPP formed at the bank layer 236, and the first electrode 241 and the second electrode 243 come into contact with the emitting layer 242 disposed therebetween, the sub-emissive area parts SEAP are formed.

As illustrated in the embodiment of FIG. 9B, the electroluminescent display device 100 may include a first electrode 241, an emitting layer 242 disposed on the first electrode 241, and a second electrode 243 disposed on the emitting layer 242.

The openings OP and the opening patterns OPP may be formed to expose the first electrode 241.

Accordingly, the first electrode 241, the emitting layer 242, and the second electrode 243 may be smoothly disposed without a stepped part therebetween.

That is, since the second electrode 243 in an area in which the opening patterns OPP are formed is formed in a smooth area (as shown in FIG. 9B) without a stepped part (as shown in FIG. 9A), the second electrode 243 may be stably formed without a disconnection in the process. A portion of the second electrode 243 formed on the smooth surface of the emitting layer 242 may be more likely to satisfy a design value and not become reduced in thickness during manufacturing, relative to another portion of the second electrode 243 formed on a stepped part due to the openings OP.

Consequently, even when the second electrode 243, which is disposed in an area (e.g., corresponding to an opening OP) in which the opening patterns OPP are not formed, is disconnected, since the second electrode 243 formed at the opening patterns OPP is electrically connected, degradation of image quality due to disconnection may be prevented.

Further, since the sub-emissive area parts SEAP, which correspond to the areas in which the opening patterns OPP are formed, as well as the main emissive area parts EAP, which correspond to the areas in which the openings OP are formed, output light, light extraction efficiency may be further improved.

As illustrated in the embodiment of FIG. 9C, the electroluminescent display device 100 may include a first electrode 241, a bank layer 236 disposed on the first electrode 241 and having opening patterns OPP that expose the first electrode 241, an emitting layer 242 disposed on the first electrode 241 and the bank layer 236, and a second electrode 243 disposed on the emitting layer 242.

That is, the bank layer 236 of the electroluminescent display device 100 may include the opening patterns OPP that connect the openings OP spaced apart from each other at each subpixel SP and expose the first electrode 241.

The plurality of sub-emissive area parts SEAP may be formed due to a plurality of opening patterns OPP of the bank layer 236.

Areas of the top of the openings OP and the opening patterns OPP may be greater than or equal to areas of the bottom thereof, e.g., as shown in FIG. 9C.

The emitting layer 242 may be formed to cover the first electrode 241 and the bank layer 236, and the second electrode 243 may be formed to cover the emitting layer 242 along the shape or contour of the emitting layer 242.

As described above, as the first electrode 241 is exposed due to the opening patterns OPP formed at the bank layer 236, and the first electrode 241 and the second electrode 243 come into contact with the emitting layer 242 disposed therebetween, the sub-emissive area parts SEAP are formed.

In the electroluminescent display device 100, by disposing the bank layer 236 having the plurality of openings OP at the subpixel SP so that the bank layer 236 surrounds the plurality of main emissive area parts EAP, the optical path of light output outward from the plurality of main emissive area parts EAP is changed to a direction that is more vertical (e.g., orthogonal) relative to the second substrate 112 (shown in FIG. 3) due to the bank layer 236 surrounding the main emissive area parts EAP. Therefore, light extraction efficiency may be improved.

By disposing the opening patterns OPP which connect the openings OP therebetween, the second electrode 243 in the areas in which the opening patterns OPP are formed may be stably formed without a disconnection in the process.

Consequently, even when the second electrode 243, which is disposed in the areas in which the opening patterns OPP are not formed, is disconnected, since the second electrode 243 formed at the opening patterns OPP is electrically connected, degradation of image quality due to disconnection may be prevented.

Further, since the sub-emissive area parts SEAP, which correspond to the areas in which the opening patterns OPP are formed, as well as the main emissive area parts EAP, which correspond to the areas in which the openings OP are formed, output light, light extraction efficiency may be further improved.

Figure 10:
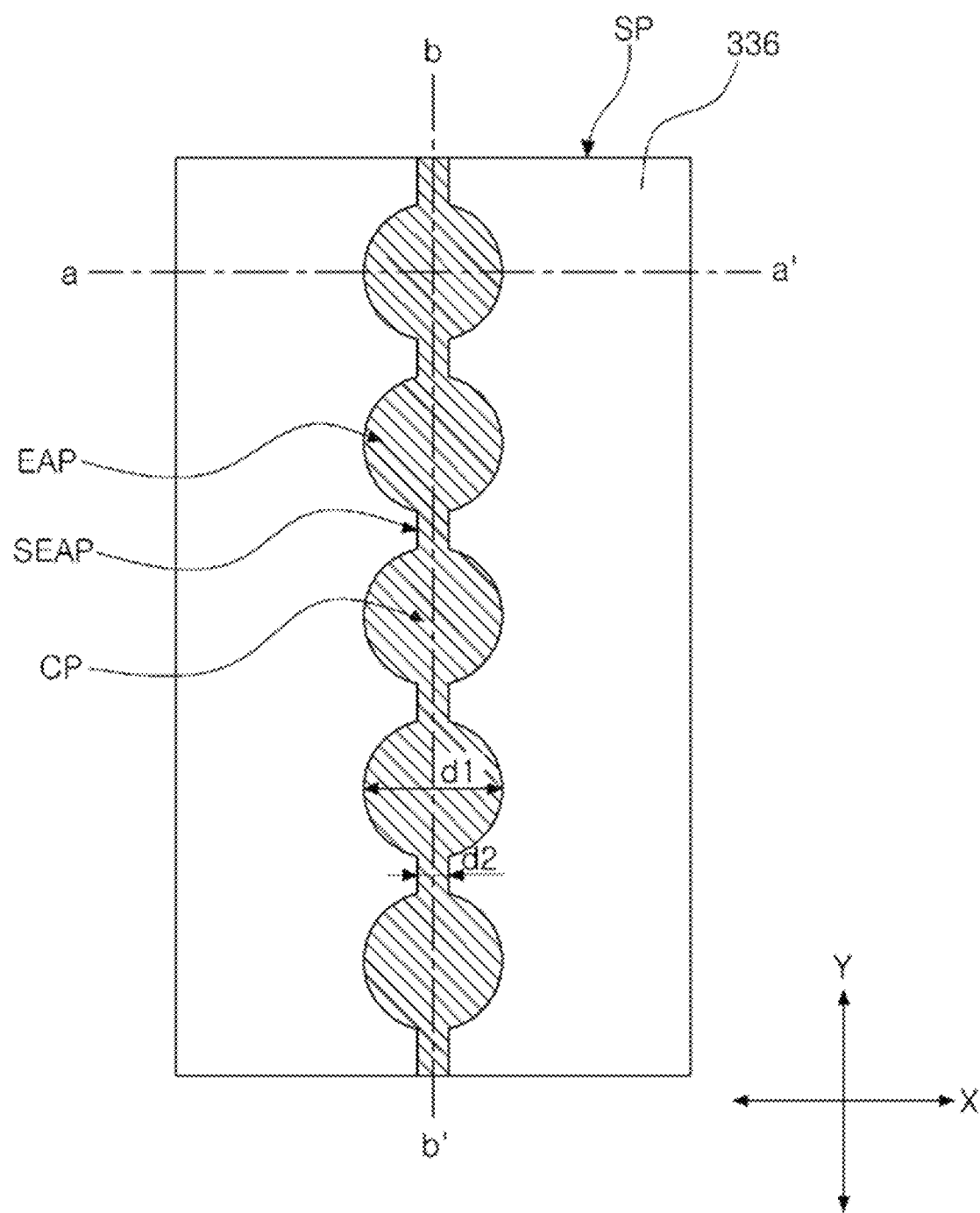
FIG. 10 is a plan view illustrating a single subpixel of an electroluminescent display device according to an embodiment of the present invention.

FIG. 10 is a plan view illustrating a single subpixel of an electroluminescent display device according to an embodiment of the present invention.

As illustrated in FIG. 10, a single subpixel SP may include a plurality of main emissive area parts EAP spaced apart from each other.

For example, when the subpixel SP is a red subpixel SP, the single subpixel SP may include a plurality of red main emissive area parts EAP configured to emit red light.

When the subpixel SP is a green subpixel SP, the single subpixel SP may include a plurality of green main emissive area parts EAP configured to emit green light.

When the subpixel SP is a blue subpixel SP, the single subpixel SP may include a plurality of blue main emissive area parts EAP configured to emit blue light.

When the subpixel SP is a white subpixel SP, the single subpixel SP may include a plurality of white main emissive area parts EAP configured to emit white light.

In the embodiment of FIG. 10, the electroluminescent display device 100 may include sub-emissive area parts SEAP configured to connect the main emissive area parts EAP disposed to be spaced apart from each other.

For example, the sub-emissive area parts SEAP may be disposed to connect the main emissive area parts EAP, which have a circular shape, in a Y-axis direction.

The sub-emissive area parts SEAP may be formed in a bar shape, but embodiments are not limited thereto.

For light to be uniformly emitted from the subpixel SP, the main emissive area parts EAP may be horizontally and/or vertically symmetrical with respect to a central point CP of the subpixel SP, but embodiments are not limited thereto.

The main emissive area parts EAP may be disposed at equal intervals in the Y-axis direction as shown in FIG. 10, but embodiments are not limited thereto. In other embodiments, the main emissive area parts EAP may be disposed at unequal intervals in the Y-axis direction.

A single sub-emissive area part SEAP may be disposed to connect the main emissive area parts EAP to be spaced apart from each other, or a plurality of sub-emissive area parts SEAP may be connected to a single main emissive area part EAP.

For example, the sub-emissive area parts SEAP may connect the spaced-apart main emissive area parts EAP in the Y-axis direction, but embodiments are not limited thereto, and the sub-emissive area parts SEAP may connect the main emissive area parts EAP in various other directions.

Since the sub-emissive area parts SEAP are disposed in the form of connecting the main emissive area parts EAP, a width d2 of the sub-emissive area parts SEAP may be formed to be narrower than a width d1 of the main emissive area parts EAP.

The size, number, width, and connection relationship of the main emissive area parts EAP and the sub-emissive area parts SEAP may vary in accordance with a type, size, or other attributes of an electronic product, e.g., including the electroluminescent display device 100.

The plurality of main emissive area parts EAP and the sub-emissive area parts SEAP may be partitioned from each other by a bank layer 336.

That is, the bank layer 336 includes a plurality of openings configured to expose a first electrode 141 (see FIG. 3) at the single subpixel SP, and the plurality of openings respectively correspond to the main emissive area parts EAP.

The bank layer 336 may include opening patterns which connect the plurality of openings disposed at the single subpixel SP and expose the first electrode 141 (see FIG. 3), and the opening patterns may correspond to the sub-emissive area parts SEAP.

Although not illustrated, the opening patterns may also be disposed in a form of connecting main emissive area parts EAP of adjacent subpixels SP.

That is, opening patterns of adjacent subpixels SP may be connected to each other.

The openings and the opening patterns will be described in more detail below.

The plurality of main emissive area parts EAP are illustrated as having a circular shape in the plan view in FIG. 10, but embodiments are not limited thereto. That is, the plurality of main emissive area parts EAP may also have a polygonal shape, such as a triangular shape, a quadrangular shape, or a pentagonal shape, in the plan view.

Figure 11A:
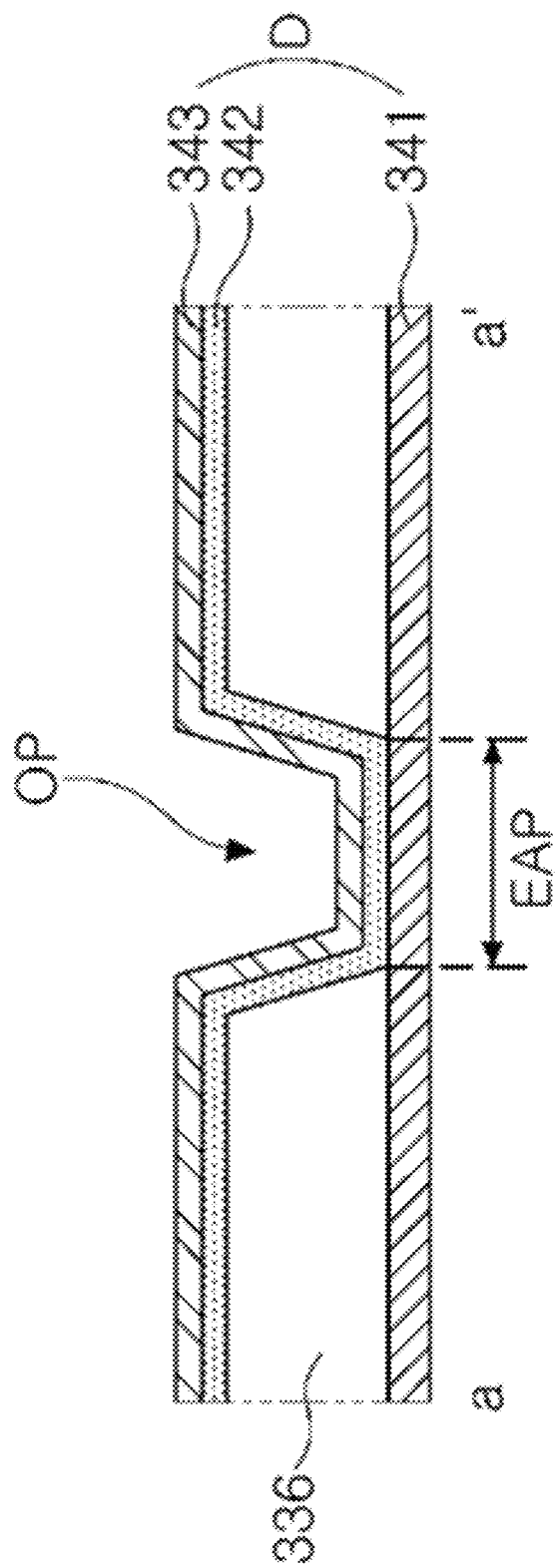
FIG. 11A is a cross-sectional view of an electroluminescent display device taken along line a-a' of FIG. 10 according to an embodiment.

FIG. 11A is a cross-sectional view of an electroluminescent display device taken along line a-a' of FIG. 10 according to an embodiment.

Figure 11B:
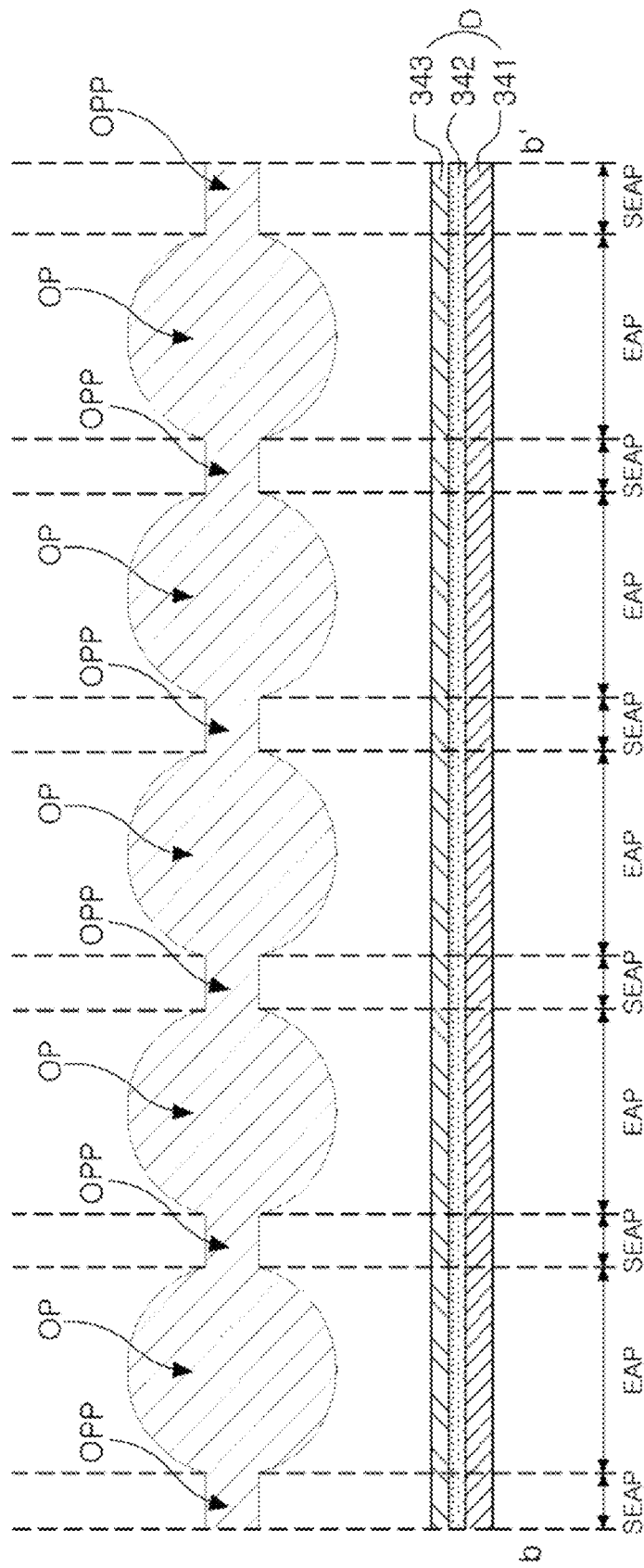
FIG. 11B is a cross-sectional view of an electroluminescent display device taken along line b-b' of FIG. 10 according to an embodiment.

FIG. 11B is a cross-sectional view of an electroluminescent display device taken along line b-b' of FIG. 10 according to an embodiment.

As illustrated in the embodiment of FIG. 11A, the electroluminescent display device 100 may include a first electrode 341, the bank layer 336 disposed on the first electrode 341 and having openings OP that expose the first electrode 341, an emitting layer 342 disposed on the first electrode 341 and the bank layer 336, and a second electrode 343 disposed on the emitting layer 342.

That is, the bank layer 336 of the electroluminescent display device 100 may include the openings OP that are spaced apart at each subpixel SP in the Y-axis direction (as shown in FIG. 10).

The plurality of main emissive area parts EAP may be formed due to the plurality of openings OP of the bank layer 336.

Areas of the top of the openings OP may be greater than or equal to areas of the bottom thereof, e.g., as shown in FIG. 11A.

The emitting layer 342 may be formed to cover the first electrode 341 and the bank layer 336, and the second electrode 343 may be formed to cover the emitting layer 342 along the shape or contour of the emitting layer 342.

As described above, as the first electrode 341 is exposed due to the openings OP formed in the bank layer 336, and the first electrode 341 and the second electrode 343 come into contact with the emitting layer 342 disposed therebetween, the main emissive area parts EAP are formed.

As illustrated in the embodiment of FIG. 11B, the electroluminescent display device 100 may include a first electrode 341, an emitting layer 342 disposed on the first electrode 341, and a second electrode 343 disposed on the emitting layer 342.

The openings OP and the opening patterns OPP may be formed to expose the first electrode 341.

Accordingly, the first electrode 341, the emitting layer 342, and the second electrode 343 may be smoothly disposed without a stepped part therebetween.

That is, since the second electrode 343 in an area in which the opening patterns OPP are formed is formed in a smooth area (as shown in FIG. 11B) without a stepped part (as shown in FIG. 11A), the second electrode 343 may be stably formed without a disconnection in the process. A portion of the second electrode 343 formed on the smooth surface of the emitting layer 342 may be more likely to satisfy a design value and not become reduced in thickness during manufacturing, relative to another portion of the second electrode 343 formed on a stepped part due to the openings OP.

Consequently, even when the second electrode 343, which is disposed in an area (e.g., corresponding to an opening OP) in which the opening patterns OPP are not formed, is disconnected, since the second electrode 343 formed at the opening patterns OPP is electrically connected, degradation of image quality due to disconnection may be prevented.

Further, since the sub-emissive area parts SEAP, which correspond to the areas in which the opening patterns OPP are formed, as well as the main emissive area parts EAP, which correspond to the areas in which the openings OP are formed, output light, light extraction efficiency may be further improved.

In an embodiment of the electroluminescent display device 100, by disposing the bank layer 336 having the plurality of openings OP at the subpixel SP so that the bank layer 336 surrounds the plurality of main emissive area parts EAP, the optical path of light output outward from the plurality of main emissive area parts EAP is changed to a direction that is more vertical (e.g., orthogonal) relative to the second substrate 112 (shown in FIG. 3) due to the bank layer 336 surrounding the main emissive area parts EAP. Therefore, light extraction efficiency may be improved.

By disposing the opening patterns OPP which connect the openings OP in the Y-axis direction, the second electrode 343 in the areas in which the opening patterns OPP are formed may be stably formed without a disconnection in the process.

Consequently, even when the second electrode 343, which is disposed in the areas in which the opening patterns OPP are not formed, is disconnected, since the second electrode 343 formed at the opening patterns OPP is electrically connected, degradation of image quality due to disconnection may be prevented.

Further, since the sub-emissive area parts SEAP, which correspond to the areas in which the opening patterns OPP are formed, as well as the main emissive area parts EAP, which correspond to the areas in which the openings OP are formed, output light, light extraction efficiency may be further improved.

Figure 12:
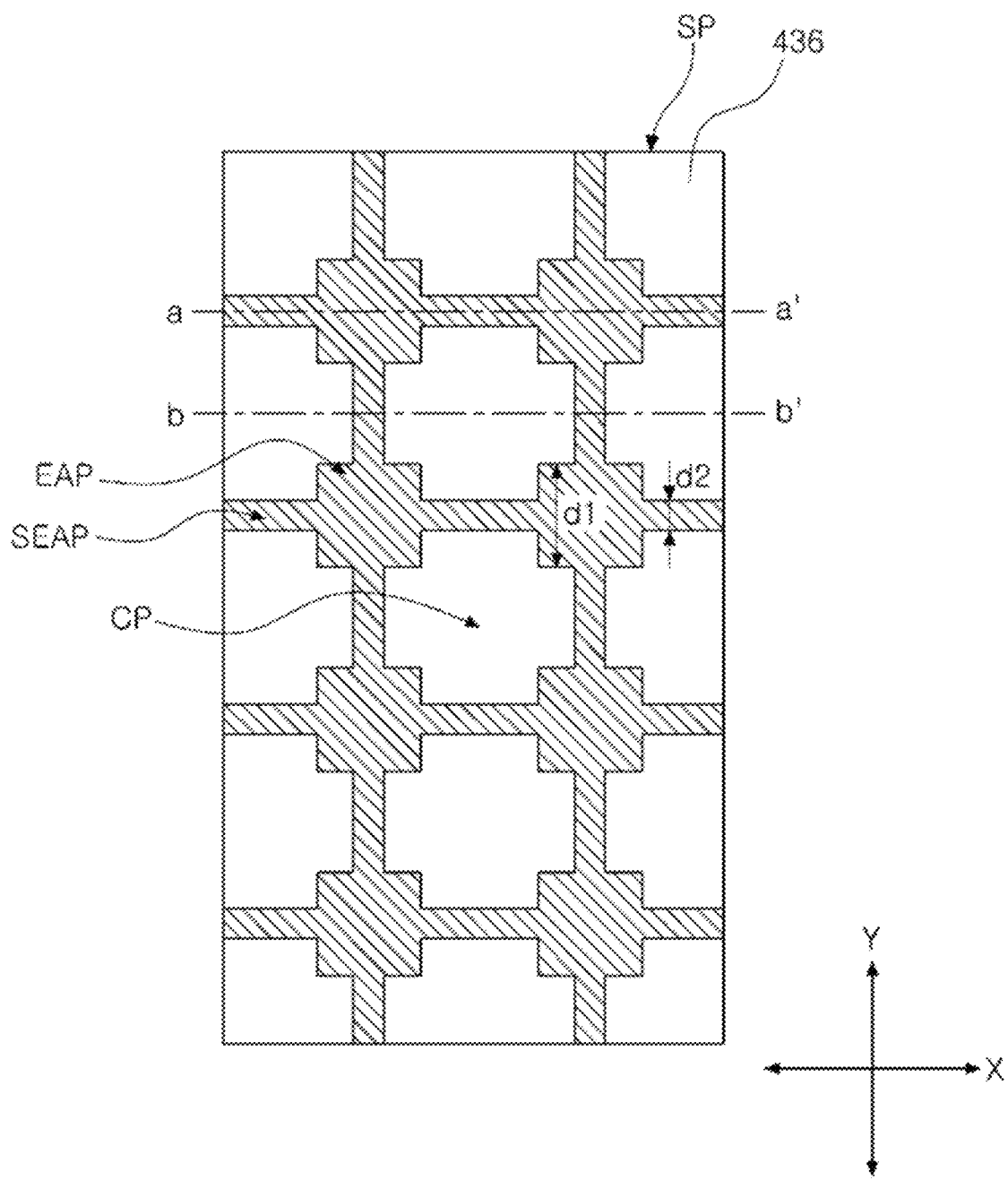
FIG. 12 is a plan view illustrating a single subpixel of an electroluminescent display device according to an embodiment of the present invention.

FIG. 12 is a plan view illustrating a single subpixel of an electroluminescent display device 100 according to an embodiment of the present invention.

As illustrated in FIG. 12, a single subpixel SP may include a plurality of main emissive area parts EAP spaced apart from each other.

For example, when the subpixel SP is a red subpixel SP, the single subpixel SP may include a plurality of red main emissive area parts EAP configured to emit red light.

When the subpixel SP is a green subpixel SP, the single subpixel SP may include a plurality of green main emissive area parts EAP configured to emit green light.

When the subpixel SP is a blue subpixel SP, the single subpixel SP may include a plurality of blue main emissive area parts EAP configured to emit blue light.

When the subpixel SP is a white subpixel SP, the single subpixel SP may include a plurality of white main emissive area parts EAP configured to emit white light.

As shown in the embodiment of FIG. 12, the electroluminescent display device 100 may include sub-emissive area parts SEAP configured to connect the main emissive area parts EAP disposed to be spaced apart from each other.

That is, the sub-emissive area parts SEAP may be disposed to connect the main emissive area parts EAP, which have a quadrangular shape in the plan view, in the X-axis direction and the Y-axis direction.

The sub-emissive area parts SEAP may be formed in a bar shape, but embodiments are not limited thereto.

For light to be uniformly emitted from the subpixel SP, the main emissive area parts EAP may be horizontally and/or vertically symmetrical with respect to a central point CP of the subpixel SP, but embodiments are not limited thereto.

The main emissive area parts EAP may be disposed at equal intervals, but embodiments are not limited thereto. In other embodiments, the main emissive area parts EAP may be disposed at unequal intervals or at two or more different predetermined intervals.

A single sub-emissive area part SEAP may be disposed to connect the main emissive area parts EAP spaced apart from each other, or a plurality of sub-emissive area parts SEAP may be connected to a single main emissive area part EAP.

In the embodiment shown in FIG. 12, the sub-emissive area parts SEAP may connect the spaced-apart main emissive area parts EAP in the X-axis direction and the Y-axis direction, but embodiments are not limited thereto. For instance, the sub-emissive area parts SEAP may connect the main emissive area parts EAP in one or more various other directions such as diagonal.

Since the sub-emissive area parts SEAP are disposed in the form of connecting the main emissive area parts EAP, a width d2 of the sub-emissive area parts SEAP may be formed to be narrower than a width d1 of the main emissive area parts EAP.

The size, number, width, and connection relationship of the main emissive area parts EAP and the sub-emissive area parts SEAP may vary in accordance with a type, size, or other attributes of an electronic product, e.g., including the electroluminescent display device 100.

The plurality of main emissive area parts EAP and the sub-emissive area parts SEAP may be partitioned from each other by a bank layer 436.

That is, the bank layer 436 includes a plurality of openings configured to expose a first electrode 141 (shown in FIG. 3) at the single subpixel SP, and the plurality of openings correspond to the main emissive area parts EAP.

The bank layer 436 may include opening patterns which connect the plurality of openings disposed at the single subpixel SP and expose the first electrode 141 (shown in FIG. 3), and the opening patterns may correspond to the sub-emissive area parts SEAP.

Although not illustrated in FIG. 12, the opening patterns may also be disposed to connect main emissive area parts EAP of adjacent subpixels SP.

That is, opening patterns of adjacent subpixels SP may be connected to each other at one or more sections.

The openings and the opening patterns will be described in more detail below.

The plurality of main emissive area parts EAP are illustrated as having a quadrangular shape in the plan view in FIG. 12, but embodiments are not limited thereto. For example, the plurality of main emissive area parts EAP may also have various shapes, such as circular, triangular, or pentagonal, in the plan view.

Figure 13A:
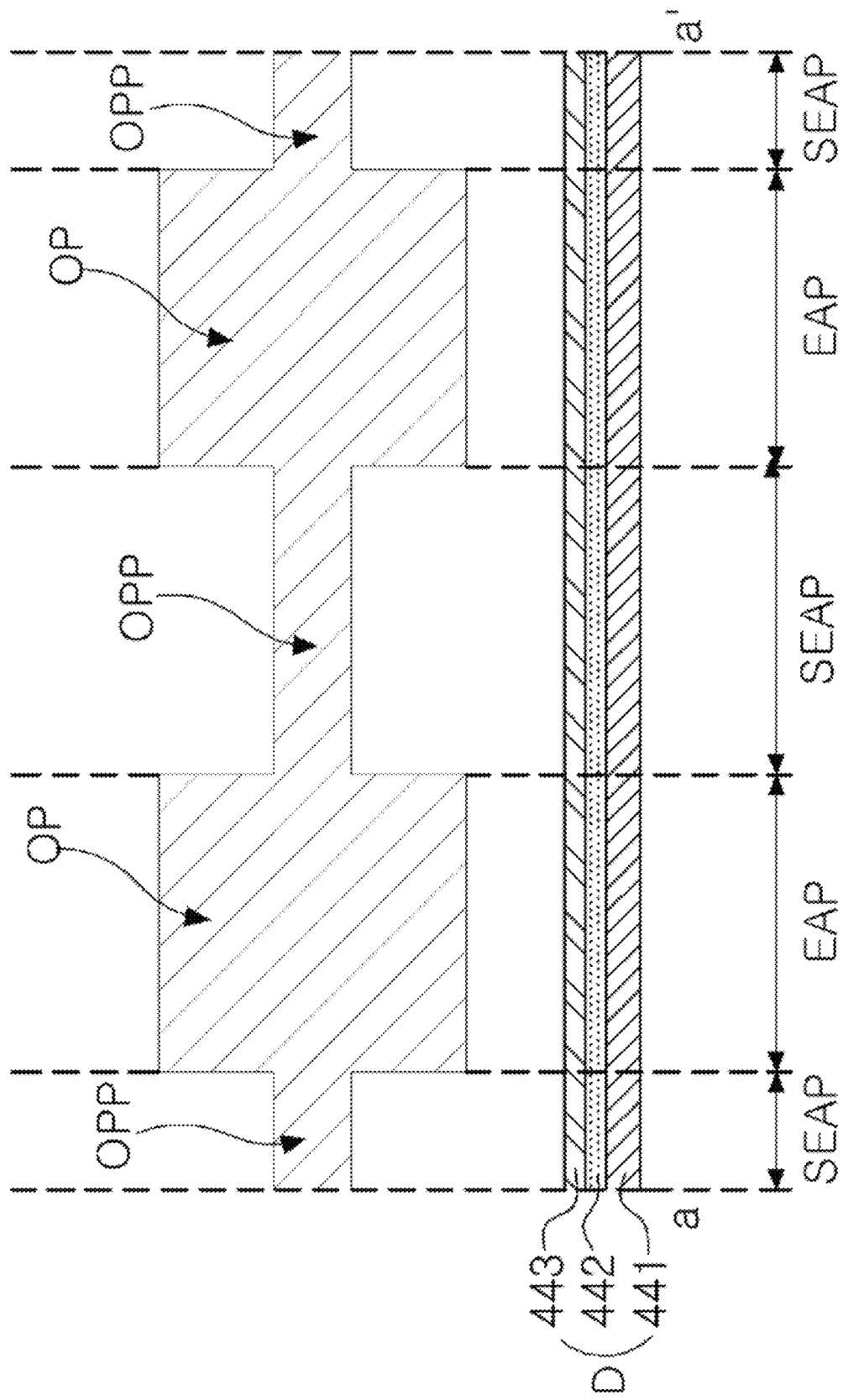
FIG. 13A is a cross-sectional view of an electroluminescent display device taken along line a-a' of FIG. 12 according to an embodiment.

FIG. 13A is a cross-sectional view of an electroluminescent display device taken along line a-a' of FIG. 12 according to an embodiment.

Figure 13B:
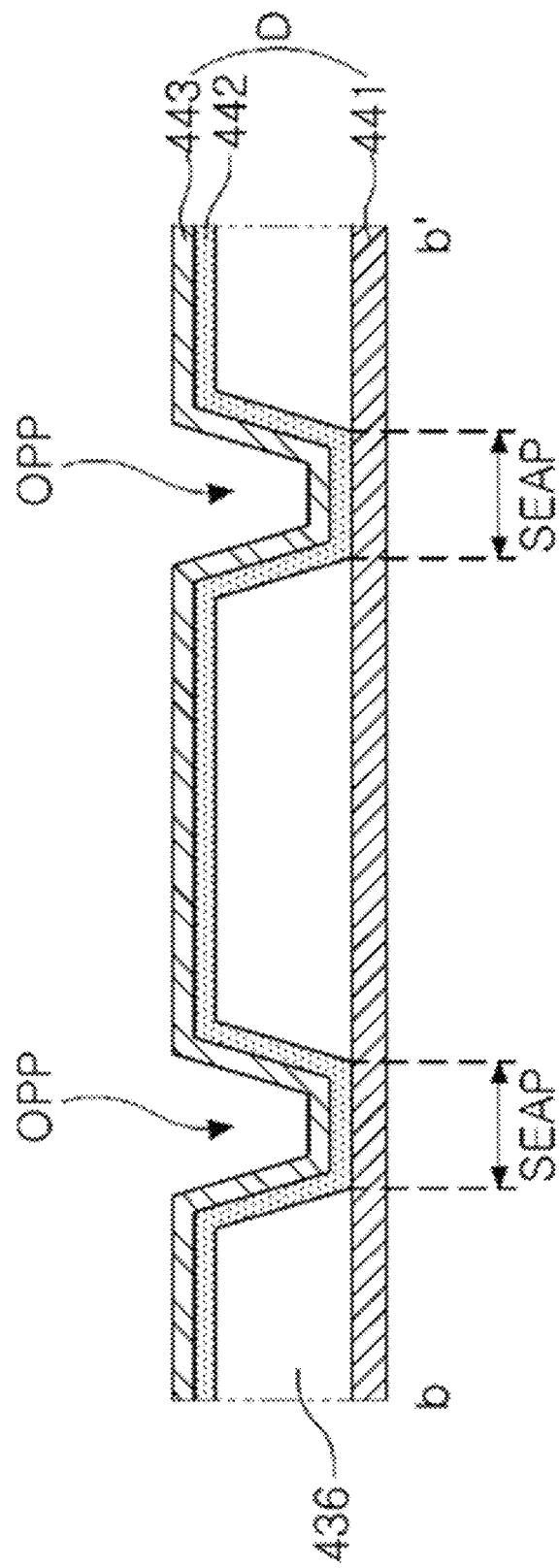
FIG. 13B is a cross-sectional view of an electroluminescent display device taken along line b-b' of FIG. 12 according to an embodiment.

FIG. 13B is a cross-sectional view of an electroluminescent display device taken along line b-b' of FIG. 12 according to an embodiment.

As illustrated in the embodiment of FIG. 13A, the electroluminescent display device 100 may include a first electrode 441, an emitting layer 442 disposed on the first electrode 441, and a second electrode 443 disposed on the emitting layer 442.

The openings OP and the opening patterns OPP may be formed to expose the first electrode 441.

Accordingly, the first electrode 441, the emitting layer 442, and the second electrode 443 may be smoothly disposed without a stepped part therebetween.

That is, since the second electrode 443 in an area in which the opening patterns OPP are formed is formed in a smooth area (as shown in FIG. 13A) without a stepped part (as shown in FIG. 13B), the second electrode 443 may be stably formed without a disconnection in the process. A portion of the second electrode 443 formed on the smooth surface of the emitting layer 442 may be more likely to satisfy a design value and not become reduced in thickness during manufacturing, relative to another portion of the second electrode 443 formed on a stepped part due to the openings OP.

Consequently, even when the second electrode 443, which is disposed in an area (e.g., corresponding to an opening OP) in which the opening patterns OPP are not formed, is disconnected, since the second electrode 443 formed at the opening patterns OPP is electrically connected, degradation of image quality due to disconnection may be prevented.

Further, since the sub-emissive area parts SEAP, which correspond to the areas in which the opening patterns OPP are formed, as well as the main emissive area parts EAP, which correspond to the areas in which the openings OP are formed, output light, light extraction efficiency may be further improved.

As illustrated in the embodiment of FIG. 13B, the electroluminescent display device 100 may include a first electrode 441, a bank layer 436 disposed on the first electrode 441 and having opening patterns OPP that expose the first electrode 441, an emitting layer 442 disposed on the first electrode 441 and the bank layer 436, and a second electrode 443 disposed on the emitting layer 442.

The plurality of sub-emissive area parts SEAP may be formed due to a plurality of opening patterns OPP of the bank layer 436.

Areas of the top of the opening patterns OPP may be greater than or equal to areas of the bottom thereof, e.g., as shown in FIG. 13B.

The emitting layer 442 may be formed to cover the first electrode 441 and the bank layer 436, and the second electrode 443 may be formed to cover the emitting layer 442 along the shape or contour of the emitting layer 442.

As described above, as the first electrode 441 is exposed due to the opening patterns OPP formed at the bank layer 436, and the first electrode 441 and the second electrode 443 come into contact with the emitting layer 442 disposed therebetween, the sub-emissive area parts SEAP are formed.

In the electroluminescent display device 100, by disposing the bank layer 436 having the plurality of openings OP at the subpixel SP so that the bank layer 436 surrounds the plurality of main emissive area parts EAP, the optical path of light output outward from the plurality of main emissive area parts EAP is changed to a direction that is more vertical (e.g., orthogonal) relative to the second substrate 112 (shown in FIG. 3) due to the bank layer 436 surrounding the main emissive area parts EAP. Therefore, light extraction efficiency may be improved.

By disposing the opening patterns OPP which connect the openings OP, the second electrode 443 in the areas in which the opening patterns OPP are formed may be stably formed without a disconnection in the process.

Consequently, even when the second electrode 443, which is disposed in the areas in which the opening patterns OPP are not formed, is disconnected, since the second electrode 443 formed at the opening patterns OPP is electrically connected, degradation of image quality due to disconnection may be prevented.

Further, since the sub-emissive area parts SEAP, which correspond to the areas in which the opening patterns OPP are formed, as well as the main emissive area parts EAP, which correspond to the areas in which the openings OP are formed, output light, light extraction efficiency may be further improved.

In the embodiments of the present invention, a bank layer having a plurality of openings is disposed, and thus an optical path is changed to a more vertical direction so that light extraction efficiency can be improved.

Further, opening patterns for connecting the openings are disposed so that deterioration of image quality due to disconnection of a second electrode can be prevented. Portions of the second electrode may be more likely to become disconnected at stepped parts of openings OP than smooth areas of opening patterns OPP. Since portions of the second electrode may be connected to each other at both openings OP and opening patterns OPP, even if a portion at an opening OP becomes disconnected, other portions at the opening patterns OPP can still maintain electrical connections of the second electrode.

It will be apparent to those skilled in the art that various modifications and variations can be made in a display device of an embodiment of the present invention without departing from the sprit or scope of the disclosure. Thus, it is intended that embodiments of the present invention cover the modifications and variations of this disclosure provided they come within the scope of the appended claims and their equivalents.

What is claimed is:

1. An electroluminescent display device comprising:
a substrate including a subpixel;
a thin film transistor disposed at the subpixel;
an overcoat layer disposed on the thin film transistor;
a first electrode disposed on the overcoat layer and electrically connected to the thin film transistor;
a bank layer disposed on the overcoat layer and the first electrode, the bank layer including:
a plurality of openings configured to expose the first electrode, and
a plurality of opening patterns formed in a bar shape to expose the first electrode and connect the plurality of openings;
an emitting layer disposed on the first electrode and the bank layer; and a second electrode disposed on the emitting layer.

2. The electroluminescent display device of claim 1, wherein an area of a top of one of the plurality of openings is greater than or equal to another area of a bottom of the one of the plurality of openings.

3. The electroluminescent display device of claim 1, wherein a shape of at least one of the plurality of openings is circular or polygonal.

4. The electroluminescent display device of claim 1, wherein a width of at least one of the plurality of openings is greater than another width of at least one of the plurality of opening patterns.

5. The electroluminescent display device of claim 1, wherein the emitting layer and the second electrode are disposed along a shape of the bank layer.

6. The electroluminescent display device of claim 1, wherein the substrate includes a plurality of subpixels, and the plurality of opening patterns of adjacent subpixels are connected to each other.

7. The electroluminescent display device of claim 1, wherein the plurality of openings are disposed at equal intervals on the bank layer.

8. The electroluminescent display device of claim 1, wherein the plurality of openings are disposed at unequal intervals on the bank layer.

9. The electroluminescent display device of claim 1, wherein at least one of the plurality of opening patterns is connected to each of the plurality of openings.

10. An electroluminescent display device comprising:
a substrate including a subpixel;
a thin film transistor disposed at the subpixel;
an overcoat layer disposed on the thin film transistor;
a first electrode disposed on the overcoat layer and electrically connected to the thin film transistor;
a bank layer disposed on the overcoat layer and the first electrode, the bank layer exposing the first electrode at openings and opening patterns;
an emitting layer disposed on the first electrode and the bank layer; and
a second electrode disposed on the emitting layer, the second electrode including:
a first plurality of portions in the openings and spaced apart from each other, and
a second plurality of portions in the opening patterns, the second plurality of portions connecting the first plurality of portions.

11. The electroluminescent display device of claim 10, wherein an area of a top of one of the openings is greater than or equal to another area of a bottom of the one of the openings.

12. The electroluminescent display device of claim 10, wherein a shape of at least one of the first plurality of portions of the second electrode is circular or polygonal.

13. The electroluminescent display device of claim 10, wherein a width of at least one of the first plurality of portions of the second electrode is greater than another width of at least one of the second plurality of portions of the second electrode.

14. The electroluminescent display device of claim 10, wherein the substrate includes a plurality of subpixels, and the second plurality of portions of the second electrode of adjacent subpixels are connected to each other.

15. The electroluminescent display device of claim 10, wherein the first plurality of portions of the second electrode are disposed at equal intervals on the bank layer.

16. The electroluminescent display device of claim 10, wherein the first plurality of portions of the second electrode are disposed at unequal intervals on the bank layer.

17. The electroluminescent display device of claim 10, wherein at least one of the second plurality of portions of the second electrode is connected to each of the first plurality of portions of the second electrode.

18. An electroluminescent display device comprising:
an anode electrode;
a bank layer exposing the anode electrode at openings and opening patterns, the openings spaced apart from each other;
a cathode electrode including a first plurality of portions in the openings and a second plurality of portions in the opening patterns, the second plurality of portions connecting the first plurality of portions; and
an emissive layer coupled between the anode electrode and the cathode electrode for emitting light through the openings.

19. The electroluminescent display device of claim 18, wherein an area of a top of one of the openings is greater than or equal to another area of a bottom of the one of the openings, and wherein a width of at least one of the first plurality of portions of the cathode electrode is greater than another width of at least one of the second plurality of portions of the cathode electrode.

20. The electroluminescent display device of claim 18, wherein the second plurality of portions of the cathode electrode connect the first plurality of portions of the cathode electrode in at least two different directions on a plane of the cathode electrode.

* * * * *